(12) United States Patent
Bowles et al.

(10) Patent No.: US 12,095,459 B2
(45) Date of Patent: Sep. 17, 2024

(54) ANTI-AGING CLOCK SOURCE MULTIPLEXING

(71) Applicant: QUALCOMM Incorporated, San Diego, CA (US)

(72) Inventors: Kevin Bowles, Mission Viejo, CA (US); Chirag Maheshwari, San Diego, CA (US); Divya Gangadharan, San Diego, CA (US); Venkat Narayanan, San Diego, CA (US); Masoud Zamani, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 209 days.

(21) Appl. No.: 17/805,014

(22) Filed: Jun. 1, 2022

(65) Prior Publication Data

US 2023/0396253 A1 Dec. 7, 2023

(51) Int. Cl.
*H03K 19/17736* (2020.01)
*H03K 19/003* (2006.01)
*H03K 19/20* (2006.01)

(52) U.S. Cl.
CPC ... *H03K 19/1774* (2013.01); *H03K 19/00323* (2013.01); *H03K 19/17744* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,353,341 B1 * | 3/2002 | Lesea | G01R 31/31922 327/205 |
| 11,689,203 B1 * | 6/2023 | Oruganti | G06F 1/3237 326/93 |
| 11,855,645 B2 * | 12/2023 | Bowman | H03K 3/017 |
| 2005/0270073 A1 | 12/2005 | Lee et al. | |
| 2009/0128207 A1 | 5/2009 | Chang et al. | |

OTHER PUBLICATIONS

Partial International Search Report—PCT/US2023/022787—ISA/EPO—Aug. 14, 2023.
International Search Report and Written Opinion—PCT/US2023/022787—ISA/EPO—Sep. 29, 2023.

* cited by examiner

*Primary Examiner* — Jany Richardson
(74) *Attorney, Agent, or Firm* — Loza & Loza, LLP

(57) ABSTRACT

In certain aspects, an apparatus includes a first gating circuit having an input and an output, wherein the input of the first gating circuit is configured to receive a first clock signal. The apparatus also includes a delay circuit having an input and an output, wherein the input of the delay circuit is coupled to the output of the first gating circuit. The apparatus further includes a control circuit configured to receive an enable signal, detect a logic state at the output of the delay circuit, and cause the first gating circuit to pass or gate the first clock signal based on the enable signal and the detected logic state at the output of the delay circuit.

27 Claims, 16 Drawing Sheets

ANTI-AGING CLOCK SOURCE MULTIPLEXING

BACKGROUND

Field

Aspects of the present disclosure relate generally to aging, and, more particularly, to aging mitigation.

Background

A system may include a clock source (e.g., a phase-locked loop) configured to generate a clock signal for timing operations of one or more circuits (e.g., sequential logic, a processor, a memory, etc.) in the system. The system may also include a clock path for distributing the clock signal from the clock source to the one or more circuits. A challenge facing clock distribution is that asymmetric aging in the clock path can cause duty-cycle distortion in the clock signal, which can lead to timing issues (e.g., timing violations) in the one or more circuits.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a first gating circuit having an input and an output, wherein the input of the first gating circuit is configured to receive a first clock signal. The apparatus also includes a delay circuit having an input and an output, wherein the input of the delay circuit is coupled to the output of the first gating circuit. The apparatus further includes a control circuit configured to receive an enable signal, detect a logic state at the output of the delay circuit, and cause the first gating circuit to pass or gate the first clock signal based on the enable signal and the detected logic state at the output of the delay circuit.

A second aspect relates to a method for glitch mitigation. The method includes receiving a first clock signal, receiving a second clock signal, passing the first clock signal to a clock path during a first mode, passing the second clock signal to the clock path during a second mode, and detecting a change from the first mode to the second mode. The method also includes, in response to detecting the change from the first mode to the second mode, detecting when a high pulse of the first clock signal is equal to or greater than a pulse width, and gating the first clock signal when the high pulse of the first clock signal is equal to or greater the pulse width.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
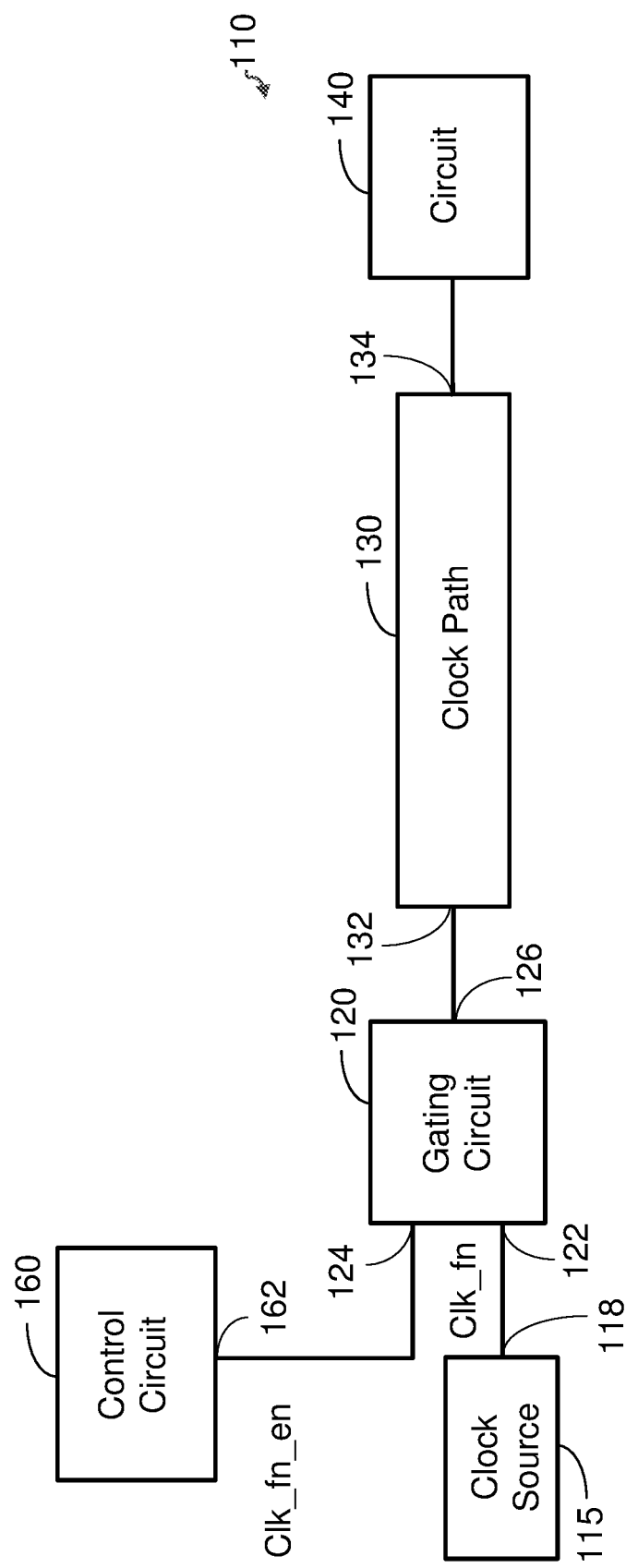
FIG. 1 shows an example of a system including a clock source, a gating circuit, a clock path, and a circuit according to certain aspects of the present disclosure.

FIG. 1 shows an example of a system 110 including a clock source 115, a gating circuit 120, a clock path 130, and a circuit 140 according to certain aspects. The circuit 140 may include sequential logic, a processor, a memory, etc. The clock source 115 is configured to generate a functional clock signal (labeled "Clk_fn") and output the functional clock signal at an output 118. The clock source 115 may be implemented with a phase-locked loop (PLL) or another type of clock source. The functional clock signal is used for timing operations of the circuit 140. The functional clock signal may also be referred to as a clock signal, an active clock signal, or another term.

The clock path 130 has an input 132 and an output 134. The output 134 is coupled to the circuit 140. The clock path 130 is configured to receive the functional clock signal at the input 132 and distribute the functional clock signal to the circuit 140. As used herein, a "clock signal" may be a periodic signal that oscillates between high and low. In this disclosure, a clock signal has a duty cycle, which may be expressed as a percentage or a fraction of a clock period (i.e., clock cycle) in which the clock signal is high (i.e., logic one).

The gating circuit 120 (also referred to as a clock gating cell) has a signal input 122, an enable input 124, and an output 126. The signal input 122 is coupled to the output 118 of the clock source 115, and the output 126 is coupled to the input 132 of the clock path 130. The enable input 124 is configured to receive a functional clock enable signal (labeled "Clk_fn_en"), and the signal input 122 is configured to receive the functional clock signal. As used herein, an "enable input" of a gating circuit is an input that controls whether the gating circuit passes (i.e., un-gates) or gates a signal received at the signal input of the gating circuit based on an enable signal received at the "enable input". In operation, the gating circuit 120 is configured to pass the functional clock signal to the output 126 or gate (i.e., block) the functional clock signal based on the functional clock enable signal. For example, the gating circuit 120 may be configured to pass the functional clock signal to the output 126 when the functional clock enable signal has a first logic state, and gate the functional clock signal when the functional clock enable signal has a second logic state. The first logic state may be high (i.e., logic one) and the second logic state may be low (i.e., logic zero), or vice versa. However, it is to be appreciated that the functional clock enable signal is not limited to this example.

In certain aspects, the functional clock enable signal is generated by a control circuit 160 having an output 162 coupled to the enable input 124 of the gating circuit 120, wherein the control circuit 160 outputs the functional clock enable signal to the gating circuit 120 via the output 162. In these aspects, the control circuit 160 controls whether the gating circuit 120 passes the functional clock signal to the clock path 130 or gates (i.e., blocks) the functional clock signal using the functional clock enable signal. In one example, the control circuit 160 may cause the gating circuit 120 to pass the functional clock signal (e.g., by setting the functional clock enable signal to the first logic state) when the circuit 140 is in an active mode (also referred to as functional mode), and cause the gating circuit 120 to gate the functional clock signal (i.e., by setting the functional clock enable signal to the second logic state) when the circuit 140 is in an idle mode (i.e., not active) to save power. Clock gating is a known technique for reducing dynamic power consumption when a circuit is not active.

Although one gating circuit 120 is shown between the clock source 115 and the clock path 130 in FIG. 1, it is to be appreciated that the system 110 may include two or more clock gating circuits (e.g., at different locations along the clock path 130). It is also to be appreciated that the clock path 130 may include multiple branches (not shown) forming a clock tree to distribute the functional clock signal to one or more other circuits (not shown) in addition to the circuit 140 shown in FIG. 1. Also, although one clock source 115 is shown in FIG. 1, it is to be appreciated that, in some implementations, the system 110 may include multiple clock sources configured to generate multiple clock signals. In these implementations, the system 110 may further include a multiplexer (not shown) configured to select one of multiple clock signals and input the selected one of the multiple clock signals to the signal input 122 of the gating circuit 120.

Aging effects such as bias temperature instability (BTI) can degrade the performance of the clock path 130 over time. For example, BTI stress in the clock path 130 during idle mode can cause a duty-cycle shift in the clock path 130 over time, which can lead to timing issues (e.g., timing violations) in the circuit 140.

Figure 2A:
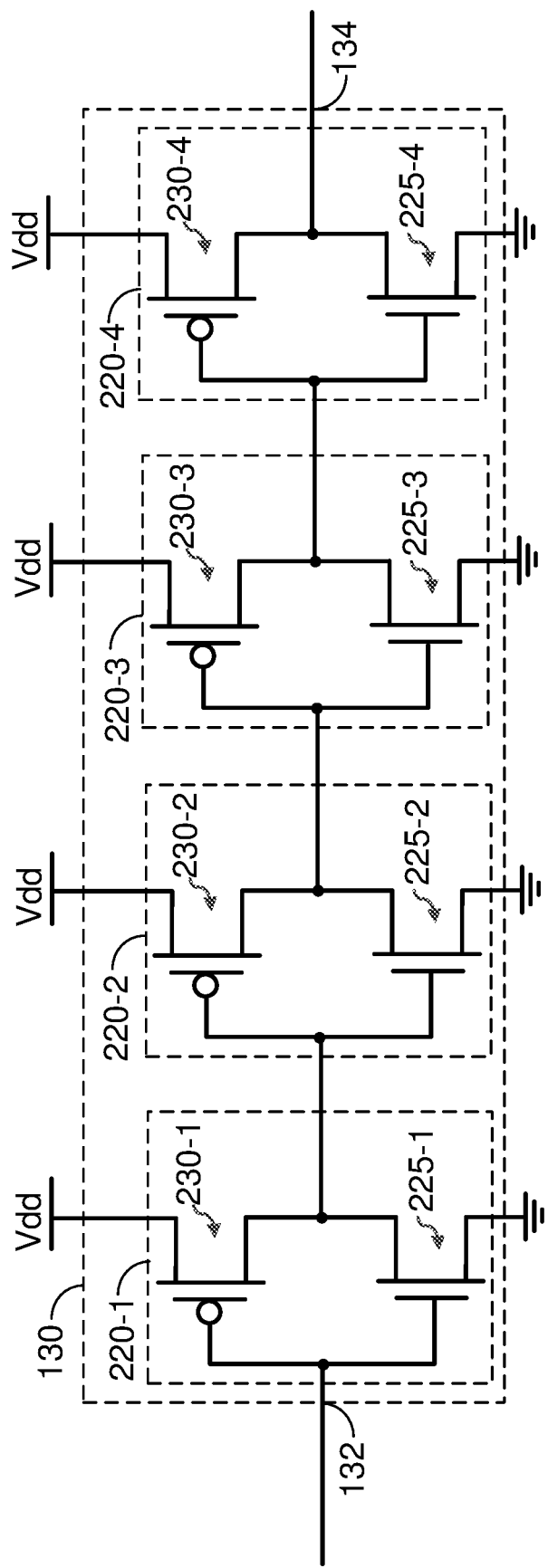
FIG. 2A shows an example of the clock path including clock buffers according to certain aspects of the present disclosure.

An example of duty-cycle shift caused by aging will now be discussed with reference to FIGS. 2A to 2E. FIG. 2A shows an example in which the clock path 130 includes clock buffers 220-1 to 220-4 coupled in series between the input 132 and the output 134. Although four clock buffers 220-1 to 220-4 are shown in FIG. 2A for simplicity, it is to be appreciated that the clock path 130 may include a large number of clock buffers. In the example shown in FIG. 2A, each of the clock buffers 220-1 to 220-4 is implemented with a respective complementary inverter including a respective one of transistors 225-1 to 225-4 (e.g., n-type field effect transistors) and a respective one of transistors 230-1 to 230-4 (e.g., p-type field effect transistors). However, it is to be appreciated that each of the clock buffers 220-1 to 220-4 may be implemented with another type of circuit or logic gate.

When the circuit 140 is in the active mode (i.e., functional mode), the gating circuit 120 passes the functional clock signal received at the signal input 122 of the gating circuit 120 to the input 132 of the clock path 130, and the functional clock signal propagates through the clock buffers 220-1 to 220-4 to the circuit 140. When the circuit 140 is in an idle mode, the gating circuit 120 gates the functional clock signal and parks (i.e., holds) the input 132 of the clock path 130 high or low.

Figure 2B:
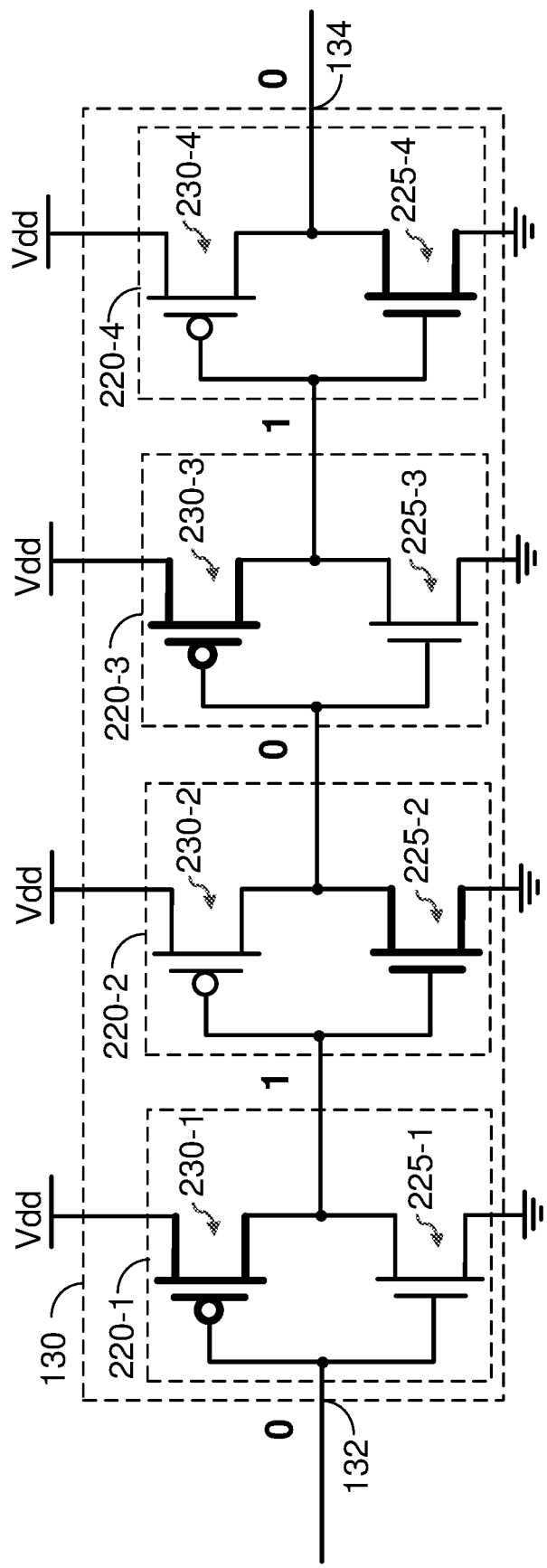
FIG. 2B shows an example in which an input of the clock path is parked low in an idle mode according to certain aspects of the present disclosure.

FIG. 2B shows an example in which the gating circuit 120 parks the input 132 of the clock path 130 low (i.e., logic zero) in the idle mode. FIG. 2B also shows the logic states at the input and the output of each of the clock buffers 220-1 to 220-4. In this example, the output 134 of the clock path 130 is low (i.e., logic zero) in the idle mode. In this example, transistors 230-1, 225-2, 230-3, and 225-4 are turned on in the idle mode and transistors 225-1, 230-2, 225-3, and 230-4 are turned off in the idle mode. In FIG. 2B, the transistors 230-1, 225-2, 230-3, and 225-4 that are turned on in the idle mode are shown with thickened lines. The transistors 230-1, 225-2, 230-3, and 225-4 that are turned on in the idle mode are stressed in the idle mode while the transistors 225-1, 230-2, 225-3, and 230-4 that are turned off in the idle mode are not stressed in the idle mode. This leads to asymmetric aging in which the transistors 230-1, 225-2, 230-3, and 225-4 that are stressed in the idle mode age faster than the transistors 225-1, 230-2, 225-3, and 230-4 that are not stressed in the idle mode.

Figure 2C:
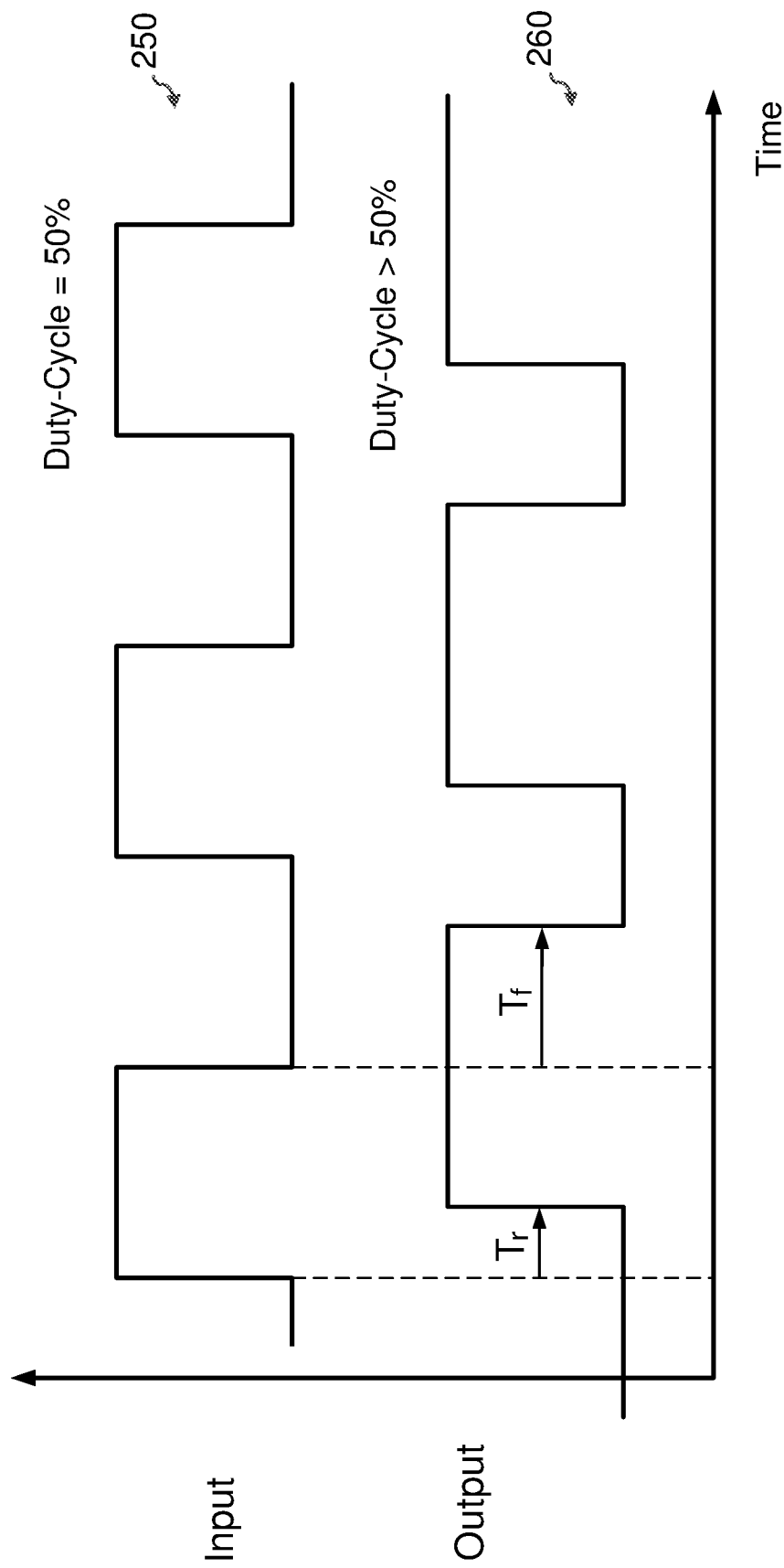
FIG. 2C is a timing diagram illustrating an example of a duty-cycle shift in the clock path due to asymmetric aging according to certain aspects of the present disclosure.

In this example, the asymmetric aging shifts the threshold voltages of the transistors 230-1, 225-2, 230-3, and 225-4 that are stressed in the idle mode, causing the falling edge delay at the output 134 of the clock path 130 to increase relative to the rising edge delay at the output 134 of the clock path 130. The increase in the falling edge delay relative to the rising edge delay causes a duty-cycle shift in the clock path 130. An example of the duty-cycle shift is illustrated in a timing diagram shown in FIG. 2C. In the example shown in FIG. 2C, the function clock signal has a duty cycle of 50% at the input 132 of the clock path 130 in the active mode. FIG. 2C also shows the functional clock signal 260 at the output 134 of the clock path 130 after propagating through the clock path 130. The clock path 130 delays a rising edge of the functional clock signal 250 by delay $T_r$ and delays a falling edge of the functional clock signal 250 by delay $T_f$. As shown in FIG. 2C, the delay $T_f$ of the falling edge is longer than the delay $T_r$ of the rising edge due to the asymmetric aging. In this example, the longer delay of the falling edge causes the duty cycle of the functional clock signal 260 at the output 134 of the clock path 130 to increase (i.e., results in a duty cycle greater than 50%).

Figure 2D:
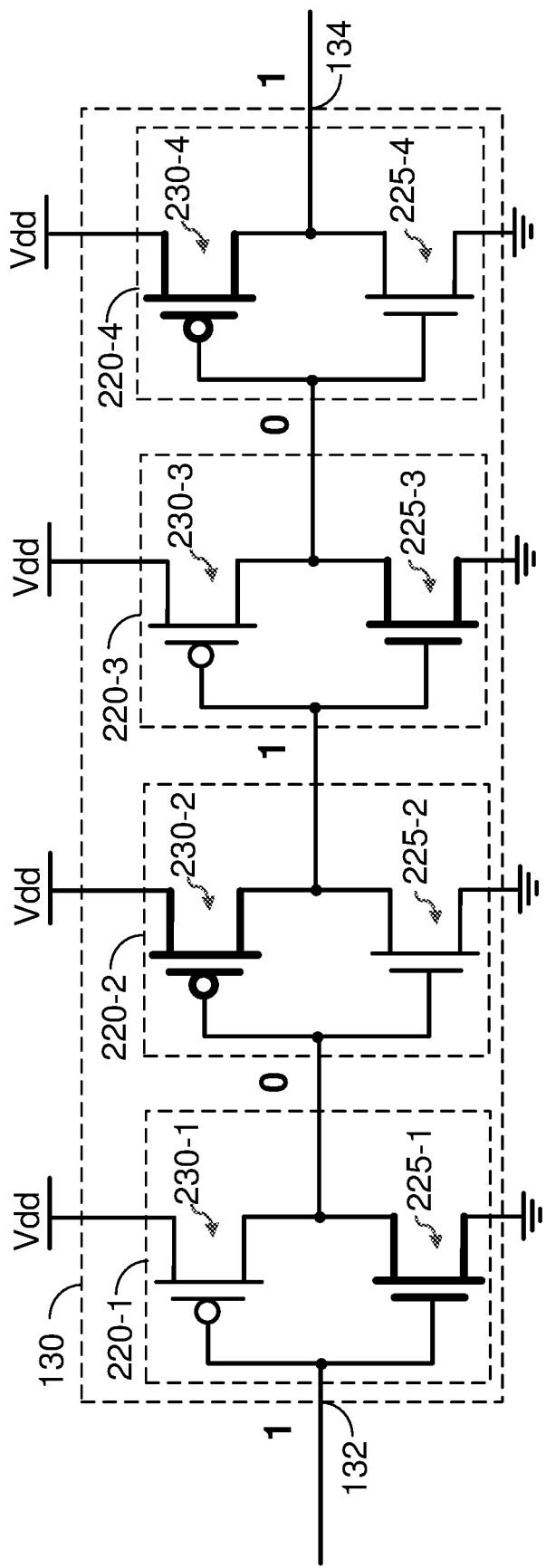
FIG. 2D shows an example in which the input of the clock path is parked high in the idle mode according to certain aspects of the present disclosure.

In the example illustrated in FIGS. 2B and 2C, the gating circuit 120 parks the input 132 of the clock path 130 low in the idle mode. Asymmetric aging also occurs for the case where the gating circuit 120 parks the input 132 of the clock path 130 high in the idle mode. In this regard, FIG. 2D shows an example in which the gating circuit 120 parks the input 132 of the clock path 130 high (i.e., logic one) in the idle mode. FIG. 2D also shows the logic states at the input and the output of each the clock buffers 220-1 to 220-4. In this example, the output 134 of the clock path 130 is high (i.e., logic one) in the idle mode. In this example, transistors 225-1, 230-2, 225-3, and 230-4 are turned on in the idle mode and transistors 230-1, 225-2, 230-3, and 225-4 are turned off in the idle mode. In FIG. 2D, the transistors 225-1, 230-2, 225-3, and 230-4 that are turned on in the idle mode are shown with thickened lines. The transistors 225-1, 230-2, 225-3, and 230-4 that are turned on in the idle mode are stressed in the idle mode while the transistors 230-1, 225-2, 230-3, and 225-4 that are turned off in the idle mode are not stressed in the idle mode, which leads to asymmetric aging in which the transistors 225-1, 230-2, 225-3, and 230-4 that are stressed in the idle mode age faster than the transistors 230-1, 225-2, 230-3, and 225-4.

Figure 2E:
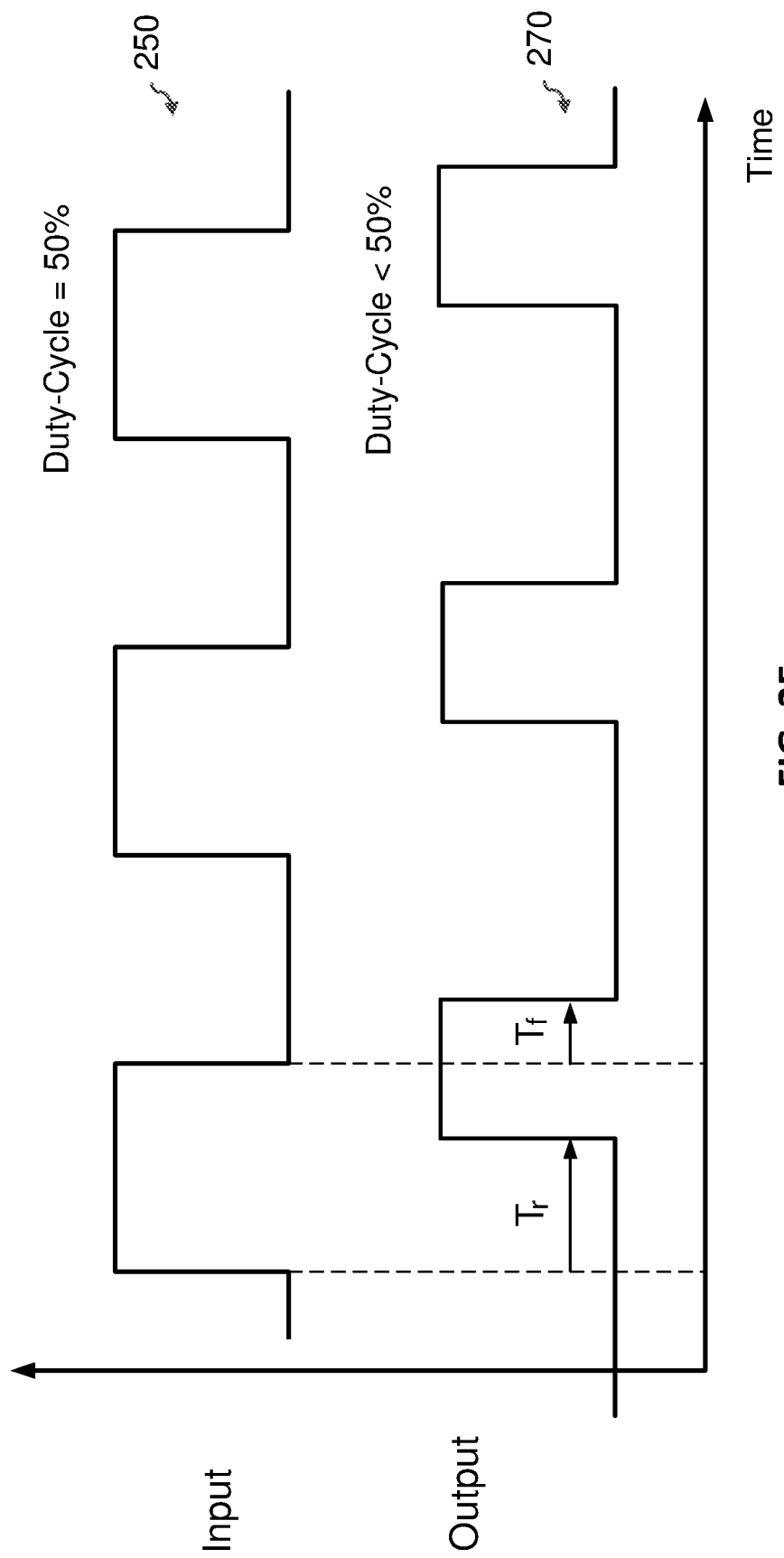
FIG. 2E is a timing diagram illustrating another example of a duty-cycle shift in the clock path due to asymmetric aging according to certain aspects of the present disclosure.

In this example, the asymmetric aging shifts the threshold voltages of the transistors 225-1, 230-2, 225-3, and 230-4 that are stressed in the idle mode, causing the rising edge delay at the output 134 of the clock path 130 to increase relative to the falling edge delay at the output 134 of the clock path 130. The increase in the rising edge delay relative to the falling edge delay causes a duty-cycle shift in the clock path 130. An example of the duty-cycle shift is illustrated in the timing diagram shown in FIG. 2E. In the example shown in FIG. 2E, the functional clock signal 250 having the duty cycle of 50% is input to the clock path 130 in the active mode. FIG. 2E also shows the functional clock signal 270 at the output 134 of the clock path 130 after propagating through the clock path 130. The clock path 130 delays a rising edge of the functional clock signal 250 by delay $T_r$ and delays a falling edge of the functional clock signal 250 by delay $T_f$ at the output 134 of the clock path 130. As shown in FIG. 2E, the delay $T_r$ of the rising edge is longer than the delay $T_f$ of the falling edge due to the asymmetric aging. In this example, the longer delay of the rising edge causes the duty cycle of the functional clock signal 270 at the output 134 of the clock path 130 to decrease (i.e., results in a duty cycle less than 50%).

Thus, asymmetric aging in the idle mode causes a duty-cycle shift (i.e., duty-cycle distortion) at the output 134 of the clock path 130 over time. The duty-cycle shift increases or decreases the duty cycle of the functional clock signal depending, for example, on whether the gating circuit 120 parks the input 132 of the clock path 130 low or high in the idle mode, and the number of clock buffers 220-1 to 220-4 in the clock path 130. The duty-cycle shift can lead to timing issues in the circuit 140. For the example where the circuit 140 includes sequential logic (e.g., flops), the duty-cycle shift can result in setup time and/or hold time violations.

To address duty-cycle distortion due to asymmetric aging, a slow clock signal may be injected into the clock path 130 in the idle mode to balance the aging of devices (e.g., transistors 225-1 to 225-4 and 230-1 to 230-4) in the clock path 130 in the idle mode. To reduce dynamic power consumption in the idle, the slow clock signal may have a frequency that is much lower (e.g., two or more orders of magnitude lower) than the frequency of the functional clock signal. The slow clock signal may also be referred to as a low-speed clock signal or another term. As used herein, the term "slow" indicates that the slow clock signal has a lower frequency than the functional clock signal.

In this approach, the much lower frequency of the slow clock signal significantly reduces dynamic power consumption in the idle mode compared with the active mode while balancing the aging of devices (e.g., transistors 225-1 to 225-4 and 230-1 to 230-4) in the clock path 130 in the idle mode to mitigate duty-cycle distortion. The slow clock signal balances the aging of devices in the clock path 130 by switching (i.e., toggling) the input 132 of the clock path 130 high and low at a low frequency instead of parking the input 132 of the clock path 130 at the same constant logic state in the idle mode.

Figure 3:
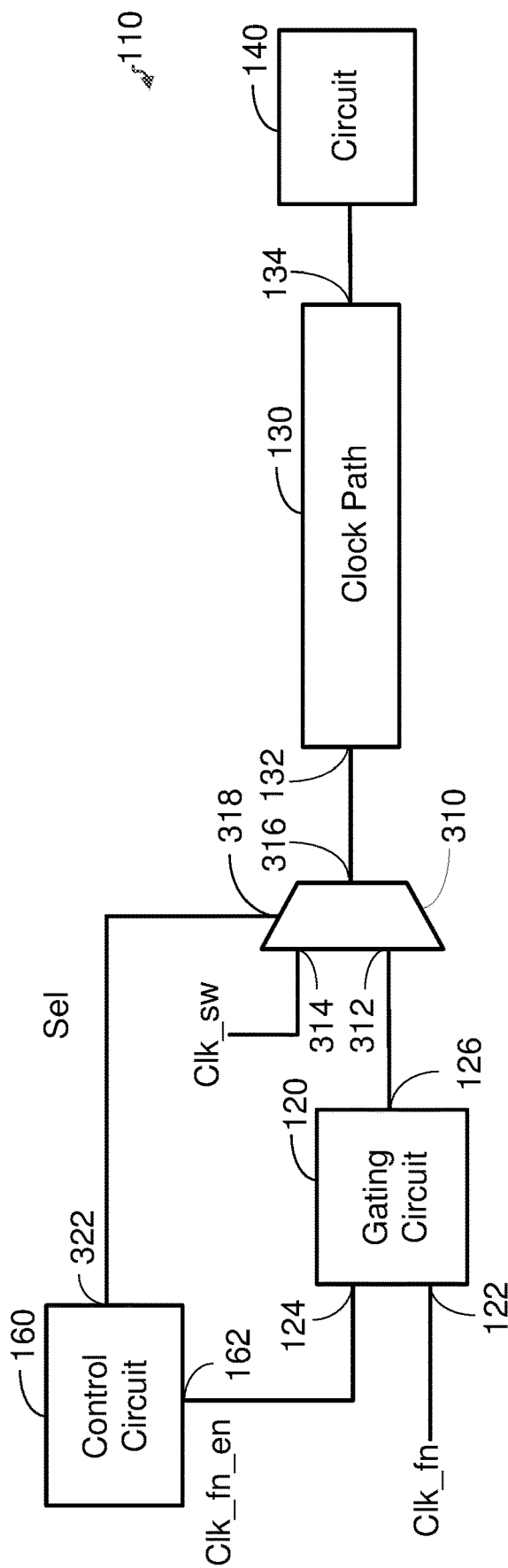
FIG. 3 shows an example in which the system further includes a multiplexer according to certain aspects of the present disclosure.

FIG. 3 shows an exemplary implementation of the above approach according to certain aspects. In this example, the system 110 includes a multiplexer 310 coupled between the gating circuit 120 the clock path 130. As discussed further below, the multiplexer 310 is used to switch the clock path 130 between the functional clock signal (labeled "Clk_fn") and the slow clock signal (labeled "Clk_sw"). The functional clock signal may come from the clock source 115 shown in FIG. 1.

The multiplexer 310 has a first input 312, a second input 314, an output 136, and a select input 318. The first input 312 is coupled to the output 126 of the gating circuit 120, the second input 314 is configured to receive the slow clock signal, and the output 316 is coupled to the input 132 of the clock path 130. The select input 318 is coupled to the control circuit 160 and configured to receive a select signal (labeled "Sel"). The select signal is provided to the multiplexer 310 by the control circuit 160 via an output 322 coupled to the select input 318 of the multiplexer 310. As used herein, a "select input" of a multiplexer is an input that controls which one of multiple inputs of the multiplexer is selected based on a select signal received at the "select input".

The multiplexer 310 is configured to select the first input 312 or the second input 314 based on the select signal, and couple to the selected one of the first input 312 and the second input 314 to the output 316. For example, the multiplexer 310 may select the first input 312 when the select signal has a first logic value and select the second input 314 when the select signal has a second logic value. The first logic value may be one and the second logic value may be zero, or vice versa.

In certain aspects, the control circuit 160 causes the multiplexer 310 to select the first input 312 in the active mode (e.g., by setting the logic value of the select signal to the first logic value). In the active mode, the multiplexer 310 passes the functional clock signal from the gating circuit 120 to the clock path 130. The functional clock signal then propagates through the clock path 130 to the circuit 140.

The control circuit 160 causes the multiplexer 310 to select the second input 314 in the idle mode (e.g., by setting the logic value of the select signal to the second logic value). In the idle mode, the multiplexer 310 passes the slow clock signal to the clock path 130. As discussed above, the slow clock signal balances aging in the clock path 130 in the idle mode to mitigate duty-cycle distortion.

When the system 110 transitions from the idle mode to the active mode, the multiplexer 310 switches from the second input 314 to the first input 312. A problem is that switching the multiplexer 310 from the second input 314 to the first input 312 may generate a narrow high pulse (referred to as a glitch) at the output 316. As used herein, a "glitch" is a high pulse with a narrow width (e.g., less than one period of the functional clock signal) that can cause timing issues in the circuit 140. For example, the multiplexer 310 may generate a glitch when the multiplexer 310 switches from the second input 314 to the first input 312 shortly after the slow clock signal transitions from low to high. The glitch may propagate through the clock path 130 to the circuit 140 and cause timing issues (e.g., setup time and/or hold time violations) in the circuit 140.

One approach to prevent the generation of a glitch is to implement the multiplexer 310 with a glitch-free multiplexer. A glitch-free multiplexer includes circuitry (e.g., pipeline registers) for preventing the generation of a glitch when the multiplexer switches between inputs. However, the glitch-free multiplexer may have a latency that is at least multiple clock periods (i.e., cycles) of the slow clock signal when switching between inputs. Since the slow clock signal has a low frequency (and hence a long clock period), this causes the glitch-free multiplexer to have a high latency. The high latency of the glitch-free multiplexer translates into a high latency when transitioning the system 110 from the idle mode to the active mode. This latency may be reduced by increasing the frequency of the slow clock signal, but at the expense of higher dynamic power consumption in the idle mode.

To prevent a glitch while avoiding the high latency of the glitch-free multiplexer, aspects of the present disclosure provide a glitch-mitigation circuit for controlling the width of a high pulse of the slow clock signal that passes through the multiplexer 310 during a transition between the idle mode and the active mode. In certain aspects, the glitch-mitigation circuit ensures that the width of a high pulse of the slow clock signal satisfies a minimum pulse width (e.g., greater than one period of the functional clock signal) to prevent timing issues. Since the period of the functional clock signal is much shorter than the period of the slow clock period, the width of the high pulse can be greater than the period of the functional clock signal to prevent timing issues while still being much shorter than the period of the slow clock signal, thereby providing much shorter latency compared with the glitch-free multiplexer. Various aspects of the present disclosure are discussed further below.

Figure 4:
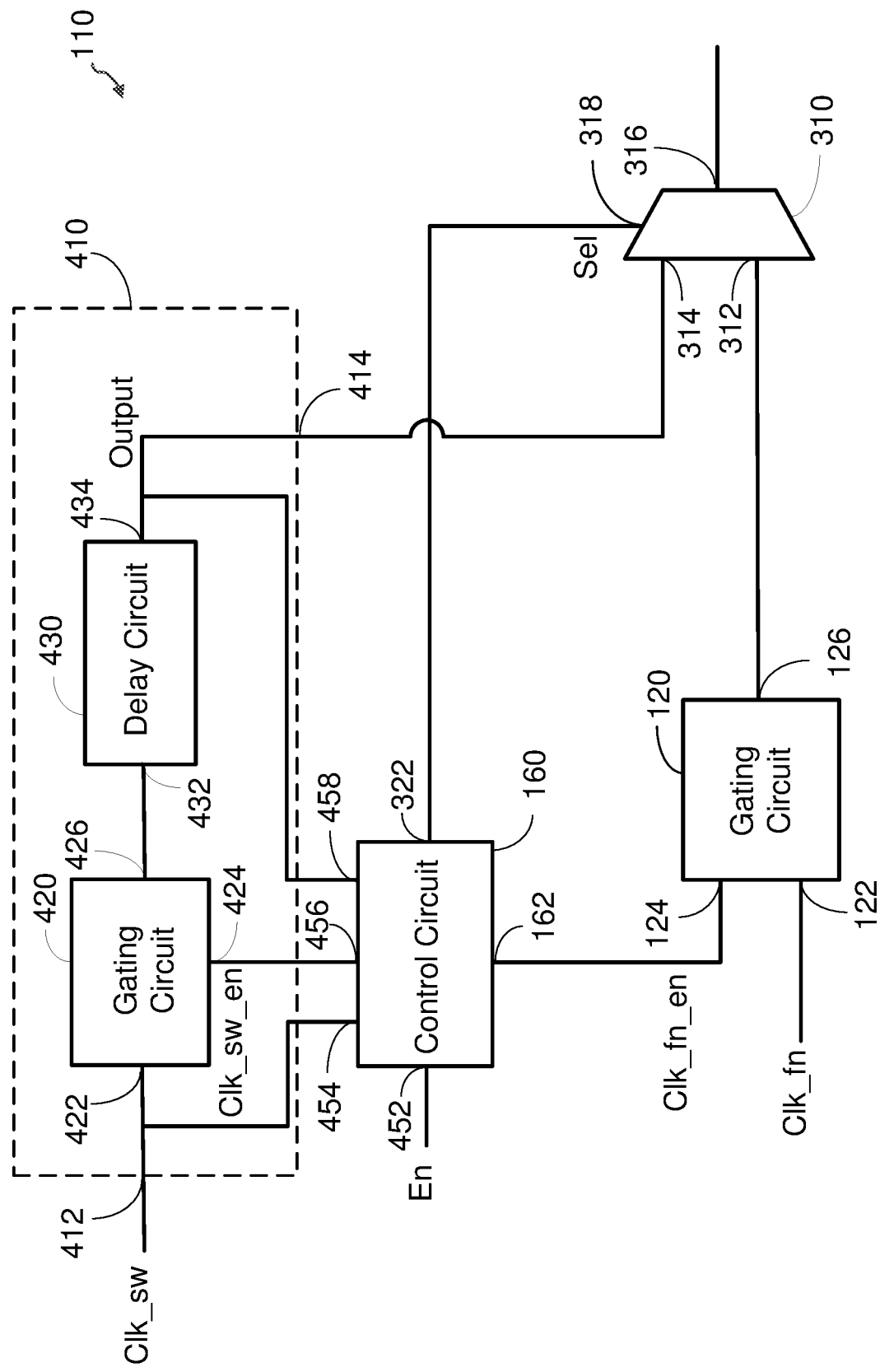
FIG. 4 shows an example in which the system further includes a glitch-mitigation circuit according to certain aspects of the present disclosure.

FIG. 4 shows an example in which the system 110 includes a glitch-mitigation circuit 410 according to certain aspects. The glitch-mitigation circuit 410 has an input 412 configured to receive the slow clock signal, and an output coupled to the second input 314 of the multiplexer 310. In this example, the slow clock signal passes through the glitch-mitigation circuit 410 to the multiplexer 310. Note that the clock path 130 and the circuit 140 are not shown in FIG. 4 for ease of illustration.

As discussed further below, the glitch-mitigation circuit 410 is configured to ensure that the width of a high pulse of the slow clock signal at the output 414 satisfies a minimum pulse width (e.g., greater than one period of the functional clock signal) to prevent the high pulse from causing timing issues in the circuit 140. In certain aspects, the width of the high pulse of the slow clock signal satisfies the minimum pulse width when the width of the high pulse is equal to or greater than the minimum pulse width. It is to be appreciated that the minimum pulse width may be greater than the absolute minimum pulse width that prevents timing issues in the circuit 140. For example, the minimum pulse width may be equal to the absolute minimum pulse width plus a margin to account for uncertainties in the system 110 and/or operating conditions. The minimum pulse width that prevents timing issues may be determined, for example, through a computer simulation of the system 110 and/or performing tests on the system 110.

In this example, the glitch-mitigation circuit 410 includes a gating circuit 420 and a delay circuit 430. The gating circuit 420 (also referred to as a clock gating cell) has a signal input 422, an enable input 424, and an output 426. The signal input 122 is coupled to the input 412 of the glitch-mitigation circuit 410 to receive the slow clock signal (labeled "Clk_sw"). The enable input 424 is configured to receive a slow clock enable signal (labeled "Clk_sw_en"). In certain aspects, the slow clock enable signal is provided to gating circuit 420 by the control circuit 160 via an output 456 coupled to the enable input 424 of the gating circuit 420.

In operation, the gating circuit 420 is configured to pass the slow clock signal to the output 426 or gate (i.e., block) the slow clock signal based on the slow clock enable signal from the control circuit 160. For example, the gating circuit 420 may be configured to pass the slow clock signal to the output 426 when the slow clock enable signal has a first logic state, and gate the slow clock signal when the slow clock enable signal has a second logic state. The first logic state may be high (i.e., logic one) and the second logic state may be low (i.e., logic zero), or vice versa. In one example, the gating circuit 420 may be implemented with an AND gate (not shown) in which a first input of the AND gate is coupled to the signal input 422, a second input of the AND gate is coupled to the enable input 424, and the output of the AND gate is coupled to the output 426. However, it is to be appreciated that the gating circuit 420 is not limited to this example.

The delay circuit 430 has an input 432 coupled to the output 426 of the gating circuit 420, and an output 434 coupled to the output 414 of the glitch-mitigation circuit 410. The delay circuit 430 is configured to receive the slow clock signal from the gating circuit 420, delay the slow clock signal by a time delay, and output the delay slow clock signal at the output 426. As discussed further below, the time delay of the delay circuit 430 may be used to control the width of a high pulse of the slow clock signal output by the glitch-mitigation circuit 410.

In the example in FIG. 4, the control circuit 450 has an input 454 coupled to the input 412 of the glitch-mitigation circuit 410 to receive the slow clock signal, and an input 458 coupled to the output 434 of the delay circuit 430. The control circuit 450 also has an input 452 configured to receive an enable signal (labeled "En"). For example, the enable signal may indicate whether the functional clock signal or the slow clock signal is to be injected into the clock path 130. For example, the enable signal may have a first logic value to indicate the functional clock signal (i.e., active mode) and a second logic value to indicate the slow clock signal (i.e., idle mode). The first logic value may be one and the second logic value may be zero, or vice versa.

Exemplary operations of the system 110 will now be discussed according to certain aspects of the present disclosure. If the enable signal indicates the functional clock signal (e.g., the enable signal has the first logic value), then the control circuit 160 causes the gating circuit 120 to pass the functional clock signal using the functional clock enable signal, and causes the gating circuit 420 in the glitch-mitigation circuit 410 to gate the slow clock signal using the slow clock enable signal. The control circuit 160 also causes the multiplexer 310 to select the first input 312 using the select signal. In this case, the functional clock signal passes through the gating circuit 120 and the multiplexer 310 to the clock path 130 (not shown in FIG. 4).

If the enable signal indicates the slow clock signal (e.g., the enable signal has the second logic value), then the control circuit 160 causes the gating circuit 120 to gate the functional clock signal using the functional clock enable signal, and causes the gating circuit 420 in the glitch-mitigation circuit 410 to pass the slow clock signal using the slow clock enable signal. The control circuit 160 also causes the multiplexer 310 to select the second input 314 using the select signal. In this case, the slow clock signal passes through the glitch-mitigation circuit 410 and the multiplexer 310 to the clock path 130 (not shown in FIG. 4).

Figure 5:
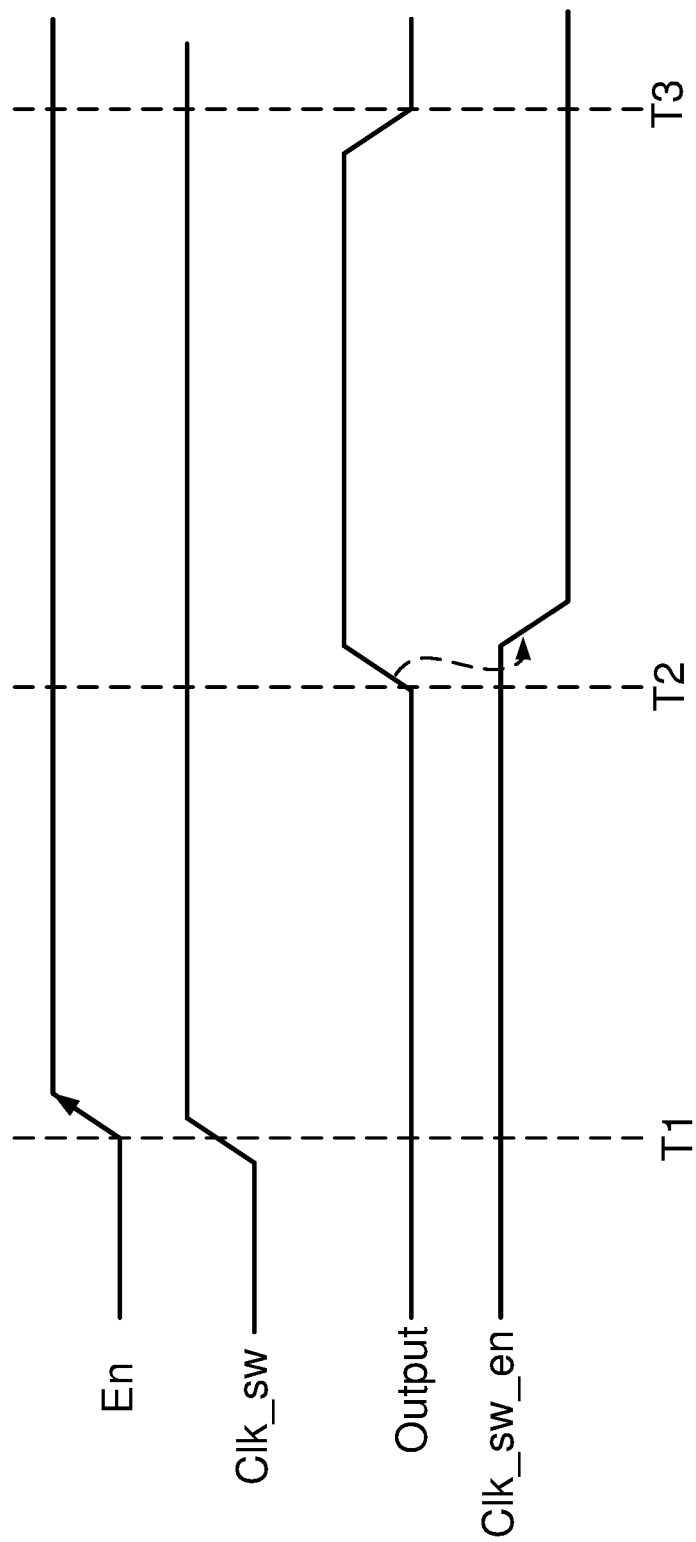
FIG. 5 shows an example of a timing diagram illustrating exemplary operations of the glitch-mitigation circuit according to certain aspects of the present disclosure.

When the system 110 transitions (i.e., changes) from the idle mode to the active mode, the control circuit 160 uses the glitch-mitigation circuit 410 to ensure that a high pulse at the output 414 of the glitch-mitigation circuit 410 satisfies the minimum pulse width to prevent timing issues. In this regard, FIG. 5 illustrates exemplary operations of the control circuit 160 and the glitch-mitigation circuit 410 during a transition (i.e., change) from the idle mode to the active mode according to certain aspects. More particularly, FIG. 5 shows an exemplary timing diagram of the enable signal (labeled "En"), the slow clock signal (labeled "Clk_sw"), the slow clock enable signal (labeled "Clk_sw_en"), and the output of the delay circuit 430 (labeled "Output") during the transition from the idle mode to the active mode. Before time T1, the enable signal has the second logic value (e.g., zero) indicating the slow clock signal, the slow clock signal is low, and the slow clock enable signal has the first logic value (e.g., one) causing the gating circuit 420 to pass the slow clock signal. At approximately time T1, the slow clock signal transitions from low to high (i.e., rising edge), which starts a high pulse.

At approximately time T1, the enable signal transitions from the second logic value (e.g., zero) to the first logic value (e.g., one) indicating a transition from the idle mode to the active mode. The transition allows the control circuit 160 to detect the change from the idle mode to the active mode. In response, the control circuit 160 detects the logic state at the signal input 422 of the gating circuit 420 via input 454 and detects the logic state at the output 434 of the delay circuit 430 via input 458. In this example, the control circuit 160 detects that the signal input 422 of the gating circuit 420 is high (i.e., logic one) and detects that the output 434 of the delay circuit 430 is low (i.e., logic zero) at time T1. This indicates that the rising edge of the slow clock signal has not yet propagated to the output 434 of the delay circuit 430 and that gating the slow clock signal at approximately time T1 would generate a narrow high pulse (i.e., glitch) potentially resulting in timing issues.

In this case, the control circuit 160 waits for the output 434 of the delay circuit 430 to become high (i.e., transition from low to high). When the output 434 becomes high at time T2, the control circuit 160 causes the gating circuit 420 to gate the slow clock signal using the slow clock enable signal. After gating the slow clock signal, the control circuit 160 waits for the output 434 of the delay circuit 430 to become low (i.e., transition from high to low). When the output 434 becomes low at time T3, the high pulse has propagated through the delay circuit 430 to the multiplexer 310.

In this example, the width of the high pulse of the slow clock signal output by the glitch-mitigation circuit 410 is at least equal to the time delay of the delay circuit 430. Thus, the width of the high pulse of the slow clock signal can be controlled by setting the time delay of the delay circuit 430 accordingly. The longer the time delay, the longer the width of the high pulse. In certain aspects, the time delay of the delay circuit 430 may be set to a time delay that ensures the width of the high pulse of the slow clock signal satisfies the minimum pulse width discussed above. After the output 434 of the delay circuit 430 goes low and the high pulse has passed through the multiplexer 310, the control circuit 160 may switch the multiplexer 310 from the second input 314 to the first input 312 using the select signal. After the multiplexer 310 switches to the first input 312, the control circuit 160 may cause the gating circuit 120 to pass the functional clock signal to the multiplexer 310 using the functional clock enable signal.

In the example illustrated in FIG. 5, the control circuit 160 detects the signal input 422 of the gating circuit 420 is high and the output 434 of the delay circuit 430 is low when the enable signal transitions from the second logic value (e.g., zero) to the first logic value (e.g., one) at time T1. If, on the other hand, the control circuit 160 detects the signal input 422 of the gating circuit 420 is high and the output 434 of the delay circuit 430 is high, then the control circuit 160 may cause the gating circuit 420 to gate the slow clock signal without waiting. This is because the high at the output 434 of the delay circuit 430 indicates that the width of the high pulse already satisfies the minimum pulse width without having to wait. In this case, after gating the slow clock signal, the control circuit 160 may wait until the high pulse passes through the delay circuit 430 and the output 434 of the delay circuit 430 goes low before switching the multiplexer 310 from the second input 314 to the first input 312.

If the control circuit 160 detects the signal input 422 of the gating circuit 420 is low and the output 434 of the delay circuit 430 is low, then the control circuit 160 may cause the gating circuit 420 to gate the slow clock signal without waiting. This is because the low at both the signal input 422 of the gating circuit 420 and the output 434 of the delay circuit 430 indicates there is currently no high pulse. After gating the slow clock signal, the control circuit 160 may switch the multiplexer 310 from the second input 314 to the first input 312.

When the system 110 transitions from the active mode to the idle mode, the control circuit 160 may cause the gating circuit 120 to gate the functional clock signal using the functional clock enable signal. After gating the functional clock signal, the control circuit 160 may cause the multiplexer 310 to switch from the first input 312 to the second input 314 using the select signal. After switching the multiplexer 310 to the second input 314, the control circuit 160 may cause the gating circuit 420 in the glitch-mitigation circuit 410 to pass (i.e., un-gate) the slow clock signal.

Figure 6:
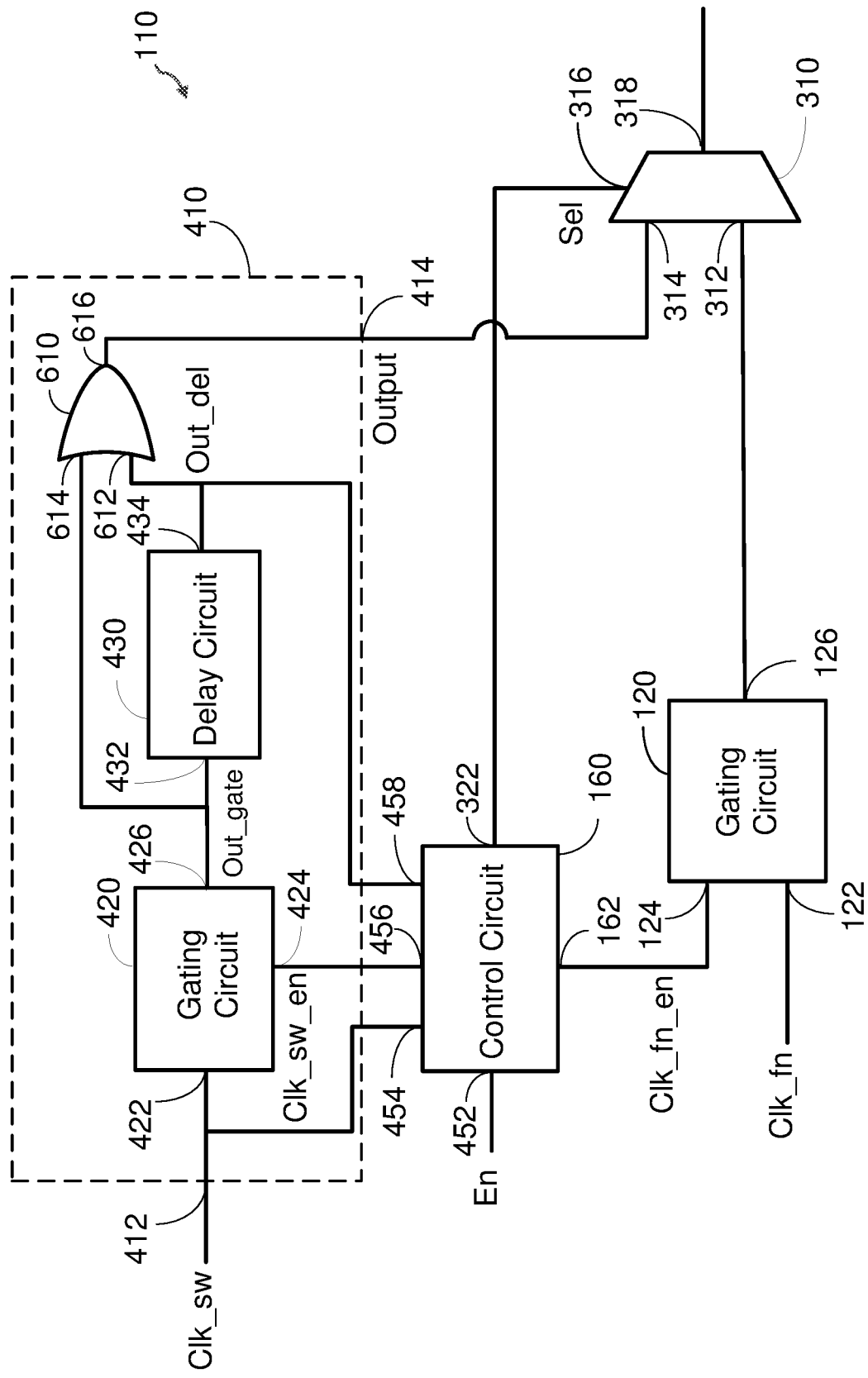
FIG. 6 shows another example of the glitch-mitigation circuit according to certain aspects of the present disclosure.

FIG. 6 shows an example in which the glitch-mitigation circuit 410 further includes an OR gate 610. As discussed further below, the OR gate 610 is configured to combine a high pulse from the gating circuit 420 with the delayed version of the high pulse from the delay circuit 430 to generate the high pulse at the output 414 of the glitch-mitigation circuit 410. It is to be appreciated that the OR gate 610 may be implemented with one or more NAND gates, one or more NOR gates, one or more inverters, one or more other logic gates, or any combination thereof.

The OR gate 610 has a first input 612, a second input 614, and an output 616. The first input is coupled to the output 434 of the delay circuit 430, the second input 614 is coupled to the output 426 of the gating circuit 420, and the output 616 is coupled to the output 414 of the glitch-mitigation circuit 410.

Figure 7:
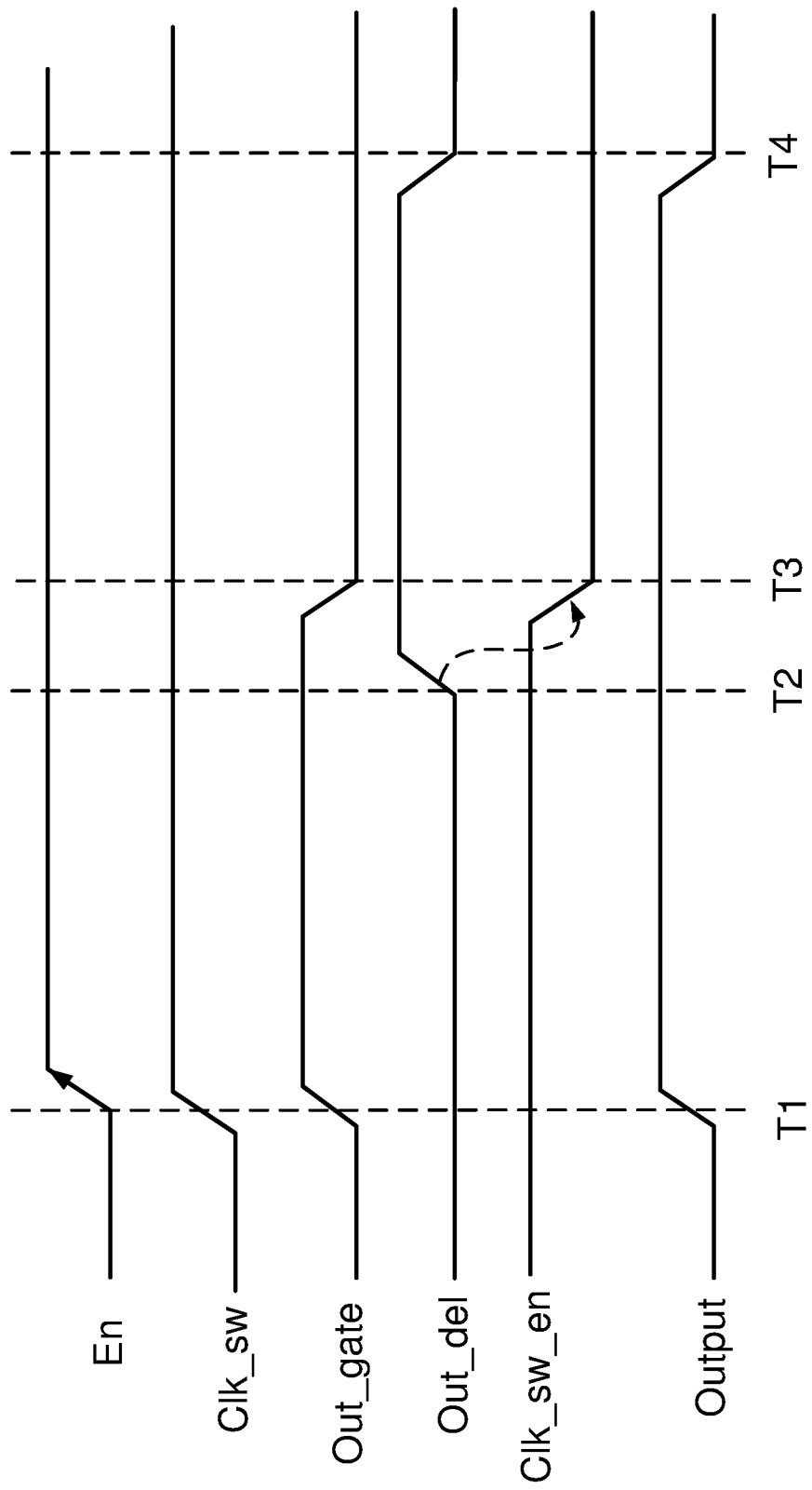
FIG. 7 shows another example of a timing diagram illustrating exemplary operations of the glitch-mitigation circuit according to certain aspects of the present disclosure.

Exemplary operations of the glitch-mitigation circuit 410 in FIG. 6 during a transition from the idle mode to the active mode will now be discussed with reference to FIG. 7 according to certain aspects of the present disclosure. FIG. 7 shows an exemplary timing diagram of the enable signal (labeled "En"), the slow clock signal (labeled "Clk_sw"), the slow clock enable signal (labeled "Clk_sw_en"), the output of the gating circuit (labeled "Out_gate"), the output of the delay circuit 430 (labeled "Out_del"), and the output of the glitch-mitigation circuit 410 (labeled "Output") during the transition from the idle mode to the active mode.

Before time T1, the enable signal has the second logic value (e.g., zero) indicating the slow clock signal, the slow clock signal is low, and the slow clock enable signal has the first logic value (e.g., one) causing the gating circuit 420 to pass the slow clock signal. At approximately time T1, the slow clock signal transitions from low to high (i.e., rising edge), which starts a high pulse.

At approximately time T1, the enable signal transitions from the second logic value (e.g., zero) to the first logic value (e.g., one) indicating a transition from the idle mode to the active mode. In response, the control circuit 160 detects the logic state at the signal input 422 of the gating circuit 420 via input 454 and detects the logic state at the output 434 of the delay circuit 430 via input 458. In this example, the control circuit 160 detects that the signal input 422 of the gating circuit 420 is high (i.e., logic one) and detects that the output 434 of the delay circuit 430 is low (i.e., logic zero) at time T1. This indicates that the rising edge of the slow clock signal has not yet propagated to the output 434 of the delay circuit 430 and that gating the slow clock signal at approximately time T1 would generate a narrow high pulse (i.e., glitch) potentially resulting in timing issues. At approximately time T1, the output 426 of the gating circuit 420 transitions from low to high. Note that the delay in the gating circuit 420 is neglected in FIG. 7 for simplicity.

In this case, the control circuit 160 waits for the output 434 of the delay circuit 430 to become high (i.e., transition from low to high). When the output 434 of the delay circuit 430 becomes high at time T2, the rising edge at the output 426 of the gating circuit 420 has propagated to the output 434 of the delay circuit 430. In response to the output 434 of the delay circuit 430 going high, the control circuit 160 may cause the gating circuit 420 to gate the slow clock signal using the slow clock enable signal. In the example in FIG. 7, the control circuit 160 waits for a short delay after detecting the output 434 of the delay circuit 430 going high before gating the slow clock signal at time T3. In this example, the short delay helps ensure that the high pulse from the output 426 of the gating circuit 420 overlaps the delayed version of the high pulse from the output 434 of the delay circuit 430.

After gating the slow clock signal, the control circuit 160 waits for the output 434 of the delay circuit 430 to become low (i.e., transition from high to low). When the output 434 becomes low at time T4, the high pulse has propagated through the delay circuit 430. After the output 434 goes low, the control circuit 160 may switch the multiplexer 310 from the second input 314 to the first input 312, as discussed above.

The OR gate 610 performs an OR operation on the high pulse from the output 426 of the gating circuit 420 and the delayed version of the high pulse from the output 434 of the delay circuit 430 to generate the high pulse at the output 414 of the glitch-mitigation circuit 410. As shown in FIG. 7, the high pulse at the output 414 is a combination of the high pulse from the output 426 of the gating circuit 420 and the delayed version of the high pulse from the output 434 of the delay circuit 430. In this example, the high pulse at the second input 614 of the OR gate 610 bypasses the delay circuit 430.

In this example, the width of the high pulse at the output 414 of the glitch-mitigation circuit 410 is greater than the time delay of the delay circuit 430 (e.g., approximately equal to twice the time delay of the delay circuit 430 minus the overlap between the high pulse from the output 426 of the gating circuit 420 and the delayed version of the high pulse from the output 434 of the delay circuit 430). Thus, the width of the high pulse at the output 414 can be controlled by setting the time delay of the delay circuit 430 accordingly. In certain aspects, the time delay of the delay circuit 430 may be set to a time delay that ensures the width of the high pulse at the output 414 satisfies the minimum pulse width for preventing timing issues discussed above.

In the example in FIG. 7, the control circuit 160 waits for a short delay after detecting the output 434 of the delay circuit 430 going high before gating the slow clock signal to ensure the high pulse from the output 426 of the gating circuit 420 overlaps the delayed version of the high pulse from the output 434 of the delay circuit 430. The overlap may also be achieved by inserting a delay element (not shown) between the output 426 of the gating circuit 420 and the second input 614 of the OR gate 610. In this example, the delay element introduces a short delay in the high pulse at the second input 614 of the OR gate 610 that helps ensure overlap between the high pulse at the second input 614 of the OR gate 610 and the delayed version of the high pulse at the first input 612 of the OR gate 610. In certain aspects, both approaches discussed above may be used in combination to ensure overlap.

In certain aspects, the delay circuit 430 may include multiple delay devices coupled in series between the input 432 and the output 434. Each of the delay devices may also be referred to as a delay stage, a delay element, a delay unit, a delay buffer, or another term. In these aspects, the time delay of the delay circuit 430 may be approximately equal to the sum of the time delays of the delay devices.

Figure 8:
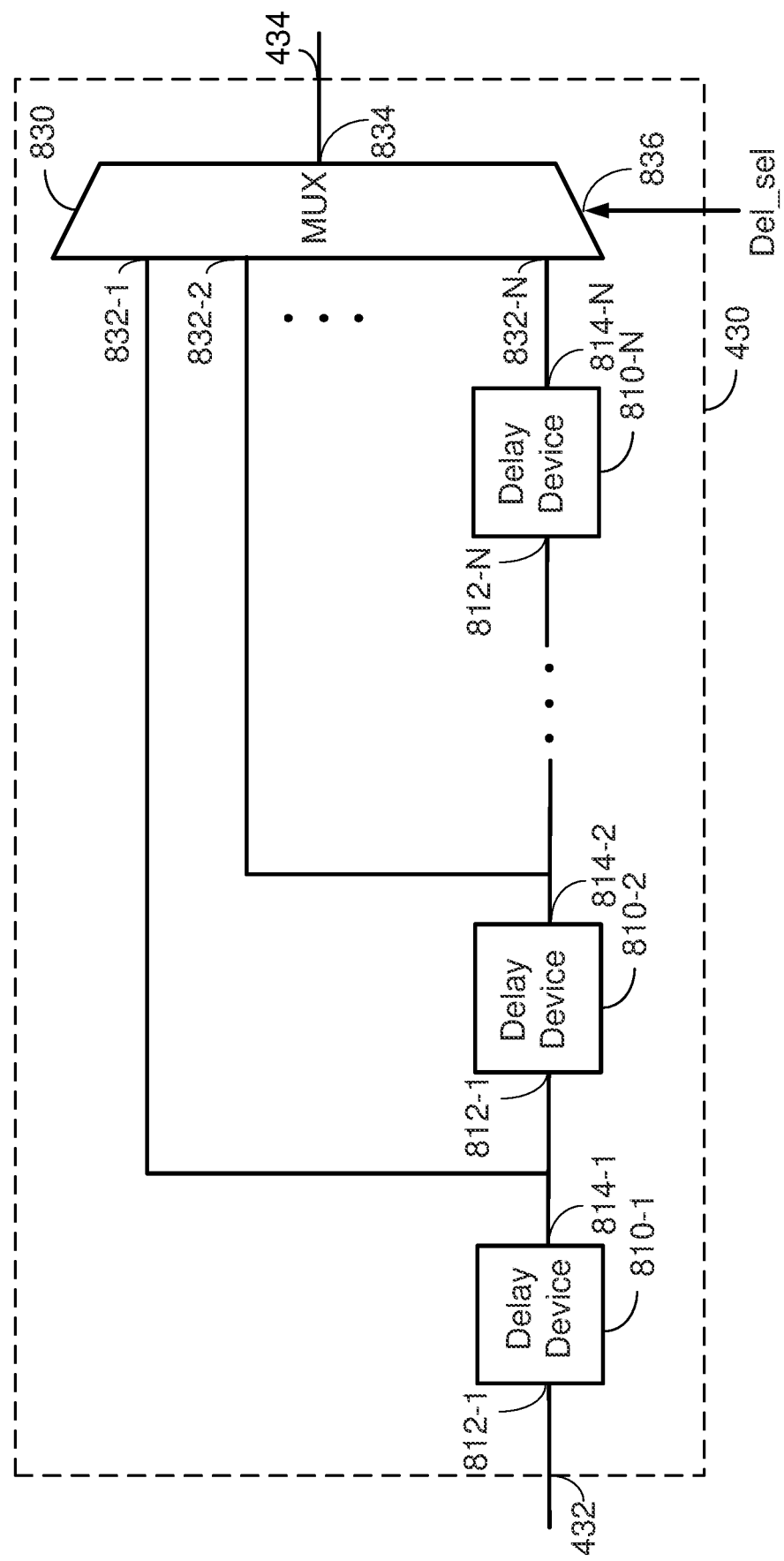
FIG. 8 shows an exemplary implementation of a delay circuit according to certain aspects of the present disclosure.

In certain aspects, the delay circuit 430 may have a programmable time delay. This allows the minimum pulse width to be programmed, for example, to adapt to various system designs, functional clock frequencies, etc. In this regard, FIG. 8 shows an exemplary implementation of the delay circuit 430 with programmable delay according to certain aspects of the present disclosure. The exemplary implementation shown in FIG. 8 may be used to implement the delay circuit 430 in FIG. 4 or FIG. 6.

In this example, the delay circuit 430 includes multiple delay devices 810-1 to 810-N coupled in series to form a delay line. Each of the delay devices 810-1 to 810-N has a respective input 812-1 to 812-N and a respective output 814-1 to 814-N. Each of the delay devices 810-1 to 810-N may have approximately the same time delay. The input 812-1 of delay device 810-1 is coupled to the input 432 of the delay circuit 430. Each of the delay devices 810-1 to 810-N may also be referred to as a delay stage, a delay element, a delay unit, a delay buffer, or another term.

The delay circuit 430 also includes a multiplexer 830 having multiple inputs 832-1 to 832-N, an output 834, and a select input 836. Each of the inputs 832-1 to 832-N of the multiplexer 830 is coupled to the output 814-1 to 814-N of a respective one of the delay devices 810-1 to 810-N in the delay line. As a result, each of the inputs 832-1 to 832-N is coupled to a different point on the delay line corresponding to a different time delay. The output 834 of the multiplexer 830 is coupled to the output 434 of the delay circuit 430, and the select input 836 of the multiplexer 830 is configured to receive a delay control signal.

The multiplexer 830 is configured to select one of the inputs 832-1 to 832-N based on the received delay control signal and coupled the selected one of the inputs 832-1 to 832-N is coupled to the output 834 of the multiplexer 830. Because each of the inputs 832-1 to 832-N is coupled to a different point on the delay line corresponding to a different time delay, the delay control signal controls the time delay of the delay circuit 430 by controlling which one of the inputs 832-1 to 832-N is selected by the multiplexer 830. In certain aspects, the delay control signal may be a digital signal including one or more bits in which the values of the one or more bits indicate one of the inputs 832-1 to 832-N.

It is to be appreciated that the delay circuit 430 is not limited to the exemplary implementation shown in FIG. 8. In general, the delay circuit 430 may include multiple delay devices and circuitry for selectively switching the delay devices into and out of the delay path between the input 432 and the output 434 of the delay circuit 430 based on the delay control signal. The circuitry may include switches, one or more multiplexers, logic gates, or any combination thereof.

Figure 9:
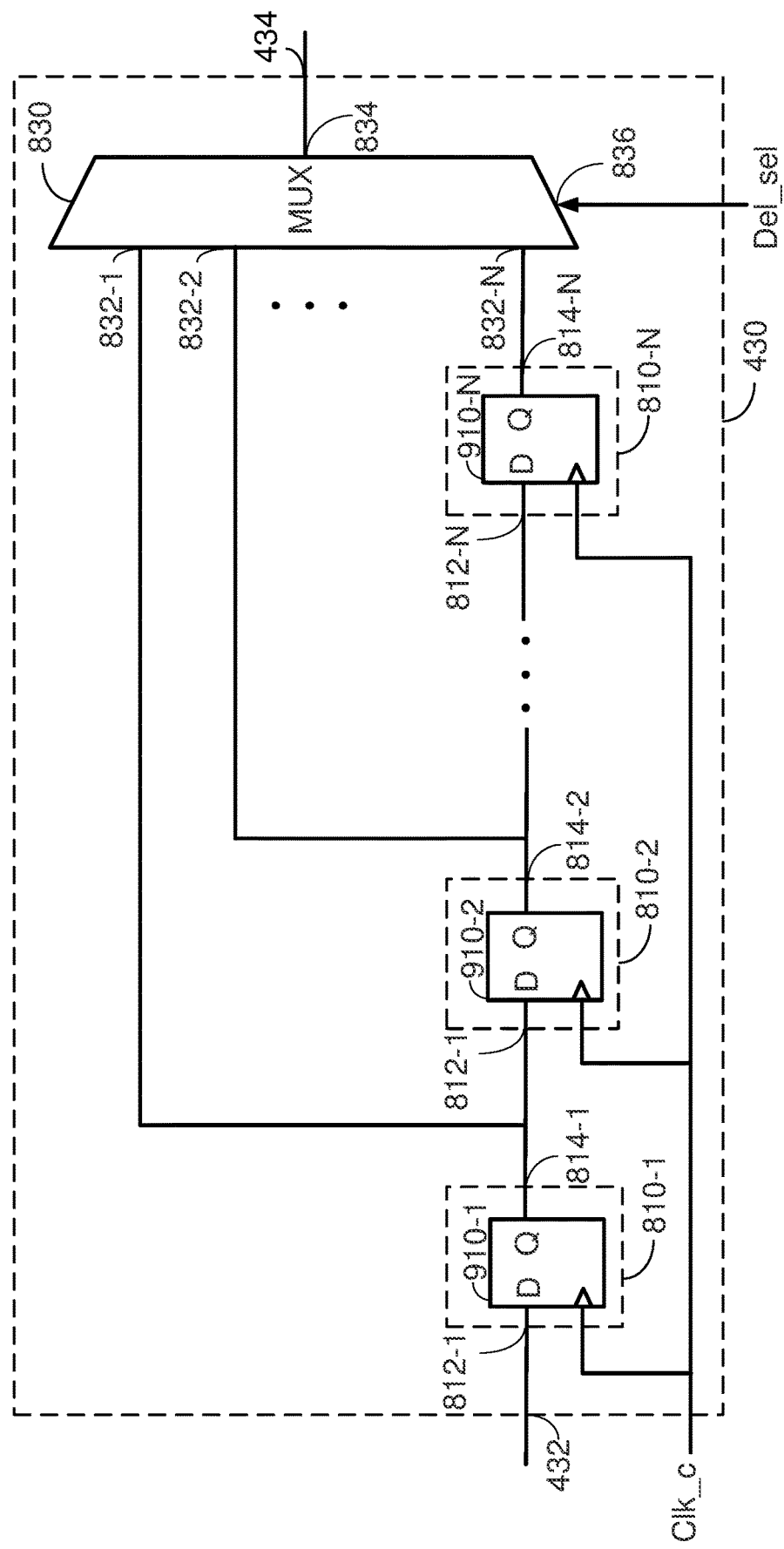
FIG. 9 shows an exemplary implementation of delay devices in the delay circuit according to certain aspects of the present disclosure.

FIG. 9 shows an exemplary implementation of the delay devices 810-1 to 810-N according to certain aspects of the present disclosure. In this example, each of the delay devices 810-1 to 810-N includes a respective register 910-1 to 910-N (e.g., D flip-flop) clocked by a control clock signal (labeled "Clk_c"). Each register 910-1 to 910-N may also be referred to as a latch, flop, or another term.

In this example, each register 910-1 to 910-N has a signal input (labeled "D"), a clock input (represented by a triangle), and an output (labeled "Q"). The clock input of each register 910-1 to 910-N is configured to receive the control clock signal. The signal input of register 910-1 is coupled to the input 432 of the delay circuit 430. The output of each of the registers 910-1 to 910-(N−1) is coupled to the signal input of the next register 910-2 to 910-N in the delay line. Each input 832-1 to 832-N of the multiplexer 830 is coupled to the output of a respective one of the registers 910-1 to 910-N.

In operation, each register 910-1 to 910-N is configured to latch the logic value at the respective signal input on a trigger edge of the control clock signal, and output the latched logic value at the respective output. The trigger edge may be a rising edge for a rising-edge triggered register or a falling edge for a falling-edge triggered register. In this example, the time delay of each register 910-1 to 910-N is approximately equal to one period (i.e., cycle) of the control clock signal. In this example, the time delay of the delay circuit 430 is approximately equal to m Tc where Tc is one period of the control clock signal and m is a multiple that can be programed using the delay control signal. For example, the time delay is approximately Tc when the delay control signal selects input 832-1, the time delay is approximately 2Tc when the delay control signal selects input 832-2, and so forth. Thus, in this example, the time delay of the delay circuit 430 is approximately equal to a multiple of the period of the control clock signal in which the multiple is programmable using the delay control signal.

The delay circuit 430 may cause a small increase in the duty cycle of the slow clock signal passing through the glitch-mitigation circuit 410. This is because the glitch-mitigation circuit 410 extends the width of a high pulse of the slow clock signal to satisfy the minimum pulse width discussed above. The duty-cycle offset can be made very small by making the frequency of the control clock signal much higher (e.g., at least two orders of magnitude high) than the frequency of the slow clock signal. This causes the period of the control clock signal to be much smaller than the period of the slow clock signal, which ensures that the extension of the high pulse of the slow clock signal caused by the glitch-mitigation circuit 410 is much smaller than the period of the slow clock signal and therefore that the extension of the high pulse has a small effect on the duty cycle of the slow clock signal. Since the period of the functional clock signal is much smaller than the period of the slow clock signal, the period of the control clock signal may also be made much smaller than the period of the slow clock signal while still allowing the extension of the high pulse by the glitch-mitigation circuit 410 to satisfy the minimum pulse width. In certain aspects, the control clock signal may have the same frequency as the functional clock signal or a frequency that is close to (e.g., within an order of magnitude of) the frequency of the functional clock signal.

Figure 10:
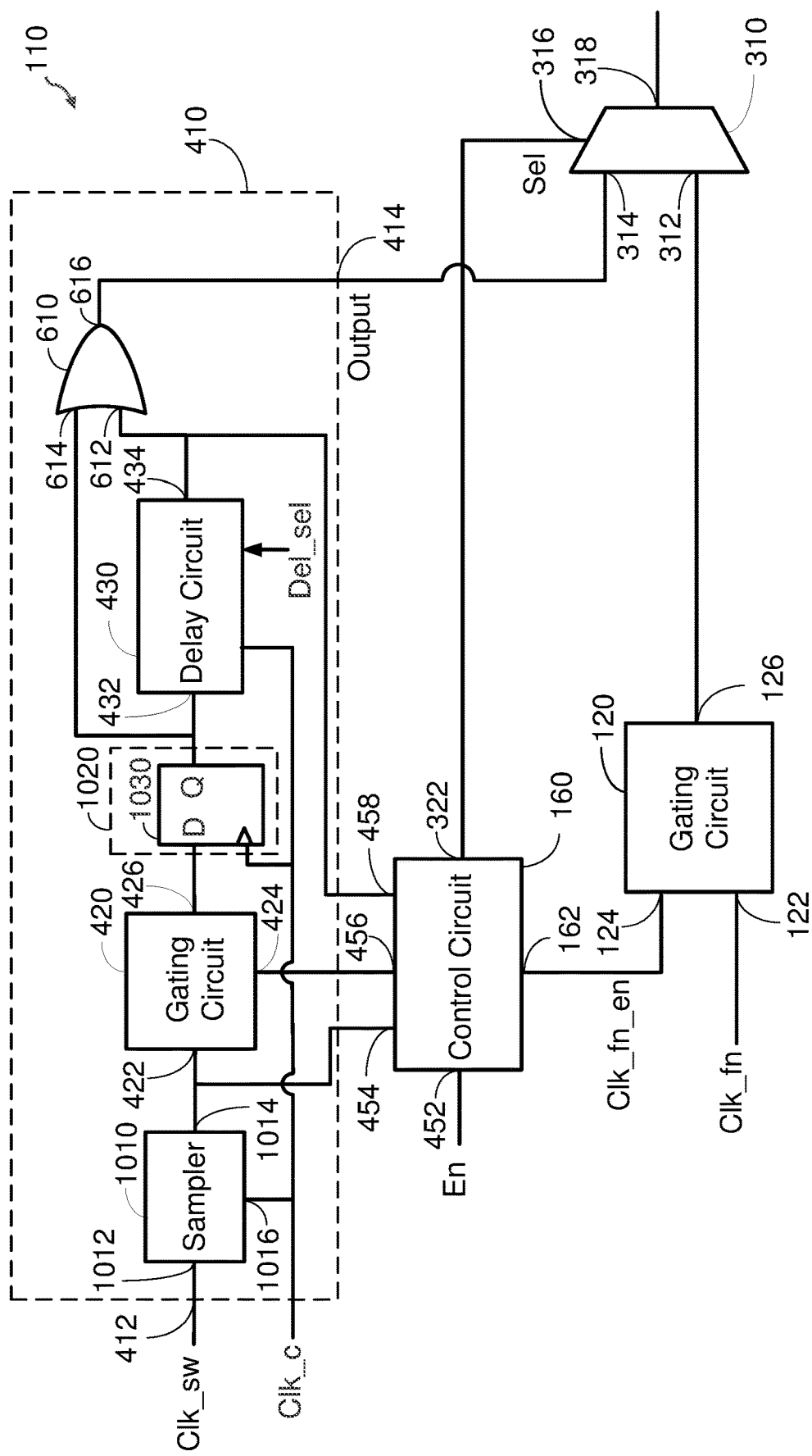
FIG. 10 shows another example of the glitch-mitigation circuit according to certain aspects of the present disclosure.

FIG. 10 shows an example in which the glitch-mitigation circuit 410 further includes a sampler 1010 and a delay device 1020. In this example, the delay circuit 430 is implemented using the exemplary implementation shown in FIG. 9.

The sampler 1010 has a signal input 1012, a clock input 1016, and an output 1014. The signal input 1012 is coupled to the input 412 of the glitch-mitigation circuit 410 to receive the slow clock signal. The clock input 1016 is configured to receive the control clock signal. The output 1014 is coupled to the signal input 422 of the gating circuit 420. In operation, the sampler 1010 is configured to sample the logic state (i.e., logic value) of the slow clock signal on edges (e.g., rising edges) of the control clock signal. The sampling of the slow clock signal on the edges of the control clock signal synchronizes the slow clock signal with the control clock signal. The sampler 1010 outputs the resulting synchronized slow clock signal at the output 1014. Thus, in this example, the gating circuit 420 receives the synchronized slow clock signal from the sampler 1010. The sampler 1010 may be implemented, for example, with one or more registers clocked by the control clock signal or another type of sampler.

The delay device 1020 is coupled between the output 426 of the gating circuit 420 and the second input 614 of the OR gate 610. The delay device 1020 is also coupled between the output 426 of the gating circuit 420 and the input 432 of the delay circuit 430. In the example in FIG. 10, the delay device 1020 is implemented with a register 1030 having a signal input (labeled "D") coupled to the output 426 of the gating circuit 420, a clock input (represented by triangle) configured to receive the control clock signal, and an output (labeled "Q") coupled to the second input 614 of the OR gate 610 and the input 432 of the delay circuit 430. In this example, the register 1030 is configured to latch the logic value at the input of the register 1030 on the trigger edge of the control clock signal, and output the latched logic value at the output of the register 1030. Since the register 1030 is clocked using the control clock signal, the register 1030 provides the delay device 1020 with a time delay of one period (i.e., cycle) of the control clock signal. Thus, in this example, the delay device 1020 delays a high pulse from the gating circuit 420 by one period (i.e., cycle) of the control clock signal before inputting the high pulse to the second input 614 of the OR gate 610 and the input 432 of the delay circuit 430. However, it is to be appreciated that the present disclosure is not limited to this example, and that the delay device 1020 may delay the high pulse by a different time delay.

Figure 11:
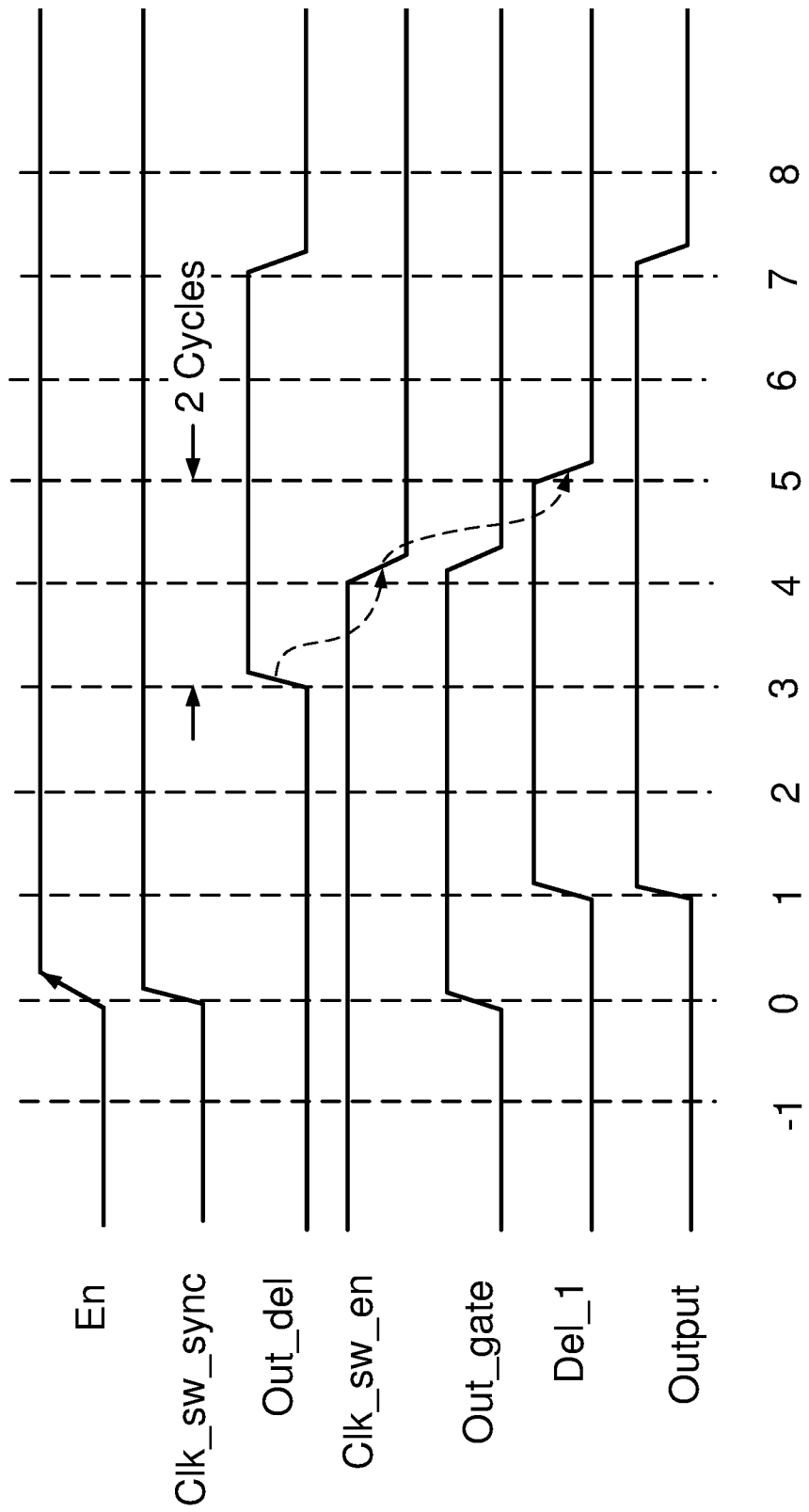
FIG. 11 shows yet another example of a timing diagram illustrating exemplary operations of the glitch-mitigation circuit according to certain aspects of the present disclosure.

Exemplary operations of the glitch-mitigation circuit 410 in FIG. 10 during a transition from the idle mode to the active mode will now be discussed with reference to FIG. 11 according to certain aspects of the present disclosure. FIG. 11 shows an exemplary timing diagram of the enable signal (labeled "En"), the synchronized slow clock signal (labeled "Clk_sw_sync"), the slow clock enable signal (labeled "Clk_sw_en"), the output of the gating circuit (labeled "Out_gate"), the output of the delay device 1020 (labeled "Del_1"), and the output of the delay circuit 430 (labeled "Out_del"), and the output of the glitch-mitigation circuit 410 (labeled "Output") during the transition from the idle mode to the active mode. In this example, the delay device 1020 is programmed to delay the synchronized slow clock signal by two periods (i.e., cycles) of the control clock signal. The total delay at the output 434 of the delay circuit 430 is the sum of the delay of the delay circuit 430 and the delay of the delay device 1020, which is approximately three periods (i.e., cycles) of the control clock signal in this example. In the discussion below a cycle refers to a period (i.e., cycle) of the control clock signal.

In the timing diagram shown in FIG. 11, time is shown on the horizontal axis in terms of periods (i.e., cycles) of the control clock signal. For example, 1 indicates one period (i.e., cycle) from time zero, 2 indicates two periods (i.e., cycles) from time zero, and so forth.

Before time zero, the enable signal has the second logic value (e.g., zero) indicating the slow clock signal, the synchronized slow clock signal is low, and the slow clock enable signal has the first logic value (e.g., one) causing the gating circuit 420 to pass the synchronized slow clock signal.

At approximately time zero, the synchronized slow cock signal transitions from low to high, and the enable signal transitions from the second logic value (e.g., zero) to the first logic value (e.g., one) indicating a transition from the idle mode to the active mode. In response to the transition of the enable signal, the control circuit 160 detects the logic state at the signal input 422 of the gating circuit 420 via input 454 and detects the logic state at the output 434 of the delay circuit 430 via input 458. In this example, the control circuit 160 detects that the signal input 422 of the gating circuit 420 is high (i.e., logic one) and detects that the output 434 of the delay circuit 430 is low (i.e., logic zero) at time zero. This indicates that the rising edge of the synchronized slow clock signal has not yet propagated to the output 434 of the delay circuit 430. At approximately time zero, the output 426 of the gating circuit 420 transitions from low to high. Note that the delay in the gating circuit 420 is neglected in FIG. 11 for simplicity. The output of the delay device 1020 transitions from low to high after a one cycle delay as shown in FIG. 11.

In this case, the control circuit 160 waits for the output 434 of the delay circuit 430 to become high (i.e., transition from low to high), which occurs after a three-cycle delay in this example. In response to the output 434 of the delay circuit 430 going high, the control circuit 160 may cause the gating circuit 420 to gate the synchronized slow clock signal using the slow clock enable signal after a one cycle delay as shown in FIG. 11.

After the synchronized slow clock signal is gated, the output of the delay device 1020 transitions from high to low after a one cycle delay as shown in FIG. 11. The control circuit 160 then waits for the output 434 of the delay circuit 430 to become low (i.e., transition from high to low). When the output 434 becomes low at approximately time 7, the control circuit 160 may switch the multiplexer 310 from the second input 314 to the first input 312, as discussed above.

The OR gate 610 performs an OR operation on the high pulse from the delay device 1020 and the high pulse from the output 434 of the delay circuit 430 to generate the high pulse at the output 414 of the glitch-mitigation circuit 410. As shown in FIG. 11, the high pulse at the output 414 is a combination of the high pulse from the delay device 1020 and the high pulse from the output 434 of the delay circuit 430. In the example in FIG. 11, the high pulse at the output 414 has a width of approximately six cycles. However, it is to be appreciated that the present disclosure is not limited to this example.

In this example, the high pulse from the delay device 1020 overlaps the high pulse from the output 434 of the delay circuit 430 by two cycles. The two-cycle overlap includes the one cycle delay in the control circuit 160 gating the synchronized slow clock signal and the one cycle delay of the delay device 1020. However, it is to be appreciated that the present disclosure is not limited to this example.

Figure 12:
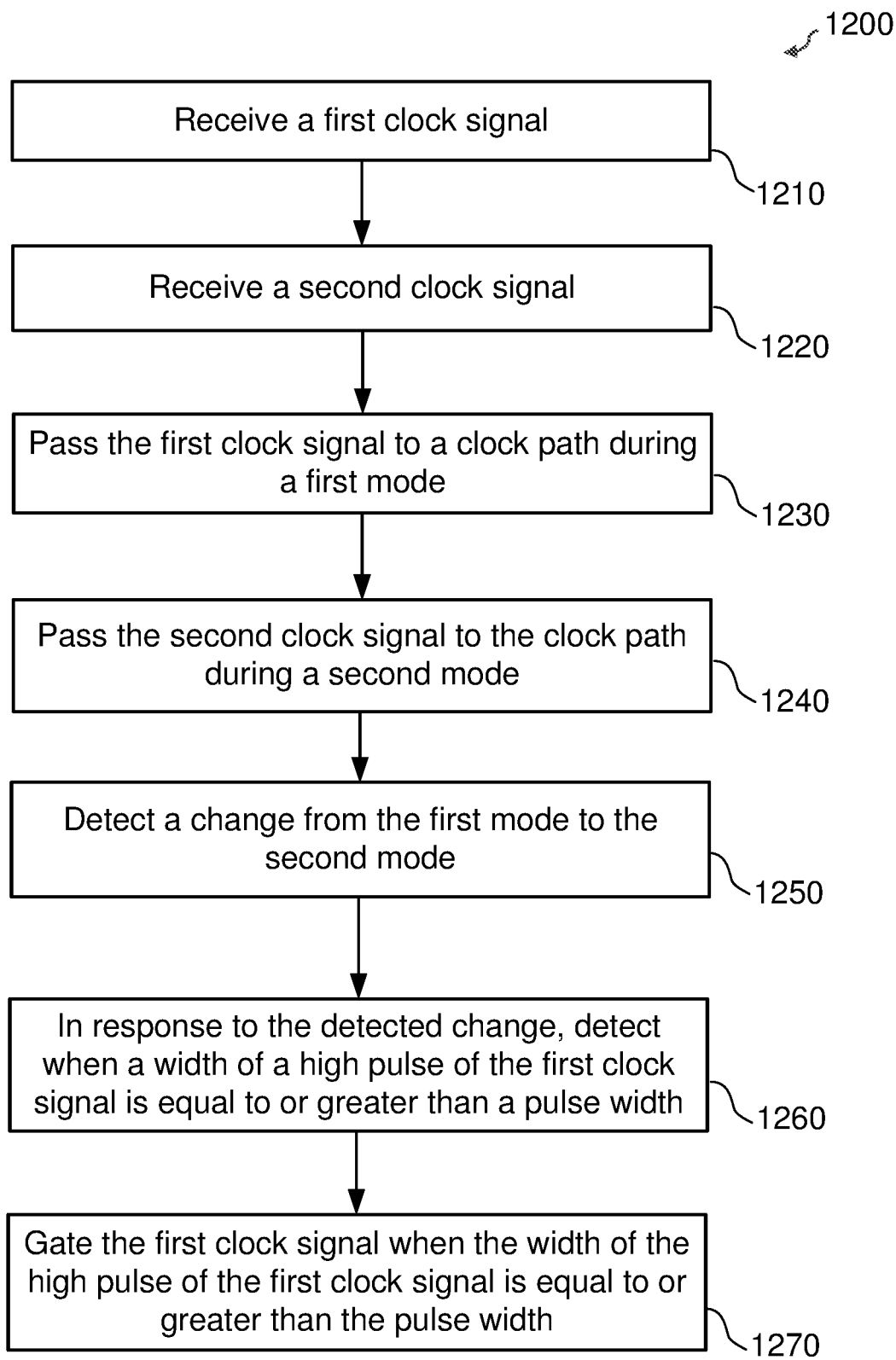
FIG. 12 is a flowchart illustrating a method for glitch mitigation according to certain aspects of the present disclosure.

FIG. 12 illustrates a method 1200 for glitch mitigation according to certain aspects. The method 1200 may be performed by the glitch-mitigation circuit 410, the control circuit 160 the multiplexer 310.

At block 1210, a first clock signal is received. The first clock signal may correspond to the slow clock signal.

At block 1220, a second clock signal is received. The second clock signal may correspond to the functional clock signal.

At block 1230, the first clock signal is passed to a clock path during a first mode. For example, the clock path may correspond to the clock path 130, and the first mode may correspond to the idle mode. The first clock signal may be passed to the clock path by the multiplexer 310.

At block 1240, the second clock signal is passed to the clock path during a second mode. For example, the second mode may correspond to the active mode. The second clock signal may be passed to the clock path by the multiplexer 310.

At block 1250, a change from the first mode to the second mode is detected. For example, the control circuit 160 may detect the change from the first mode (e.g., idle mode) to the second mode (e.g., active mode) when the enable signal changes from the second logic value (e.g., zero) to the first logic value (e.g., one).

At block 1260, in response to detecting the change from the first mode to the second mode, when a width of a high pulse of the first clock signal is equal to or greater than a minimum pulse width is detected. For example, the control circuit 160 may detect when the high pulse is equal to or greater than the pulse width when the logic state at the output of a delay circuit (e.g., delay circuit 430) is high. The pulse width may correspond to the minimum pulse width discussed above, which may be greater than a period of the second clock signal (e.g., functional clock signal).

At block 1270, the first clock signal is gated when the width of the high pulse of the first clock signal is equal to or greater the pulse width. For example, the control circuit 160 may cause the gating circuit 420 to gate the first clock signal (e.g., the slow clock signal).

In certain aspects, the method 1200 may include passing the first clock signal through a delay circuit (e.g., delay circuit 430), wherein detecting when the high pulse of the first clock signal is equal to or greater than the pulse width includes detecting a logic state at an output of the delay circuit. For example, the logic state may be detected by the control circuit 160. In certain aspects, detecting when the high pulse of the first clock signal is equal to or greater than the pulse width includes detecting the high pulse of the first clock signal is equal to or greater than the pulse width when the detected logic state at the output of the delay circuit is high.

In certain aspects, a time delay of the delay circuit is greater than a period of the second clock signal (e.g., the functional clock signal).

In certain aspects, the method 1200 may include combining the high pulse of the first clock signal passing through the delay circuit with the high pulse of the first clock signal bypassing the delay circuit to obtain a combined high pulse. For example, the combining may be performed by the OR gate 610 and the high pulse bypassing the delay circuit may propagate along the signal path between the gating circuit 420 and the second input 614 of the OR gate 610. In these aspects, passing the high pulse of the first clock signal to the clock path includes passing the combined high pulse to the clock path.

In certain aspects, the first clock signal (e.g., slow clock signal) has a first frequency, the second clock signal (e.g., functional clock signal) has a second frequency, and the second frequency is higher than the first frequency. For example, the second frequency may be at least two orders of magnitude higher (e.g., 100 times higher) than the first frequency.

In certain aspects, the method 1200 may include receiving an enable signal, wherein detecting the change from the first mode to the second mode includes detecting the change from the first mode to the second mode based on the enable signal. For example, the control circuit 160 may detect the change when the enable signal changes from the second logic value (e.g., zero) to the first logic value (e.g., one) discussed above.

In certain aspects, detecting the change from the first mode to the second mode based on the enable signal includes detecting the change from the first mode to the second mode when the enable signal changes from a first value to a second value. In these aspects, the first value may correspond to the second logic value (e.g., zero) discussed above and the second value may correspond to the first logic value (e.g., one) discussed above with reference to FIGS. 5, 7, and 11.

The control circuit 160 may be implemented with a finite state machine, a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. An apparatus, comprising:
   a first gating circuit having an input and an output, wherein the input of the first gating circuit is configured to receive a first clock signal;
   a delay circuit having an input and an output, wherein the input of the delay circuit is coupled to the output of the first gating circuit; and
   a control circuit configured to:
     receive an enable signal;
   detect a logic state at the output of the delay circuit; and
   cause the first gating circuit to pass or gate the first clock signal based on the enable signal and the detected logic state at the output of the delay circuit.
2. The apparatus of clause 1, wherein the control circuit is configured to:
   detect a change from a first mode to a second mode based on the enable signal; and
   in response to detecting the change from the first mode to the second mode, cause the first gating circuit to gate the first clock signal when the detected logic state at the output of the delay circuit changes from low to high.
3. The apparatus of clause 2, wherein the control circuit is configured to:
   cause the first gating circuit to pass the first clock signal when the enable signal indicates the first mode; and
   cause the first gating circuit to gate the first clock signal when the enable signal indicates the second mode.
4. The apparatus of clause 1, wherein the control circuit is configured to:
   detect a logic state at the input of the first gating circuit;
   detect a change from a first mode to a second mode based on the enable signal; and
   in response to detecting the change from the first mode to the second mode,
     cause the first gating circuit to pass the first clock signal when the detected logic state at the input of the first gating circuit is high and the detected logic state at the output of the delay circuit is low; and
     cause the first gating circuit to gate the first clock signal when the detected logic state at the input of the first gating circuit is high and the detected logic state at the output of the delay circuit is high.
5. The apparatus of any one of clauses 1 to 4, wherein a time delay of the delay circuit is programmable.
6. The apparatus of clause 5, wherein the delay circuit is configured to:
   receive a delay control signal comprising one or more bits, and set the time delay of the delay circuit to one of multiple time delays based on the one or more bits.
7. The apparatus of any one of clauses 1 to 6, wherein the delay circuit is configured to receive a second clock signal, and a time delay of the delay circuit is approximately equal to a multiple of a period of the second clock signal.
8. The apparatus of clause 7, wherein the multiple is programmable.
9. The apparatus of clause 7 or 8, wherein a period of the first clock signal is larger than the period of the second clock signal.
10. The apparatus of clause 9, wherein the period of the first clock signal is at least two orders of magnitude larger than the period of the second clock signal.
11. The apparatus of any one of clauses 1 to 6, further comprising an OR gate having a first input, a second input, and an output, wherein the first input is coupled to the output of the delay circuit, and the second input is coupled to the output of the first gating circuit.
12. The apparatus of clause 11, further comprising:
   a second gating circuit having an input and an output, wherein the input of the second gating circuit is configured to receive a second clock signal; and a multiplexer having a first input, a second input, and an output, wherein the first input of the multiplexer is coupled to the output of the second gating circuit, and the second input of the multiplexer is coupled to the output of the OR gate.

13. The apparatus of clause 12, further comprising a clock path coupled to the output of the multiplexer.

14. The apparatus of clause 12 or 13, wherein the first clock signal has a first frequency, the second clock signal has a second frequency, and the second frequency is higher than the first frequency.

15. The apparatus of clause 14, wherein the second frequency is at least two orders of magnitude higher than the first frequency.

16. The apparatus of any one of clauses 12 to 15, wherein a time delay of the delay circuit is greater than a period of the second clock signal.

17. The apparatus of any one of clauses 12 to 16, wherein the control circuit is configured to:
detect a change from a first mode to a second mode based on the enable signal; and
in response to detecting the change from the first mode to the second mode, cause the first gating circuit to gate the first clock signal when the detected logic state at the output of the delay circuit changes from low to high.

18. The apparatus of clause 17, wherein the control circuit is configured to:
cause the multiplexer to select the second input when the enable signal indicates the first mode; and
cause the multiplexer to select the first input when the enable signal indicates the second mode.

19. The apparatus of clause 17 or 18, wherein the control circuit is configured to: cause the first gating circuit to pass the first clock signal and cause the second gating circuit to gate the second clock signal when the enable signal indicates the first mode; and
cause the first gating circuit to gate the second clock signal and cause the second gating circuit to pass the second clock signal when the enable signal indicates the second mode.

20. A method for glitch mitigation, comprising:
receiving a first clock signal;
receiving a second clock signal;
passing the first clock signal to a clock path during a first mode;
passing the second clock signal to the clock path during a second mode;
detecting a change from the first mode to the second mode;
in response to detecting the change from the first mode to the second mode, detecting when a high pulse of the first clock signal is equal to or greater than a pulse width; and
gating the first clock signal when the high pulse of the first clock signal is equal to or greater the pulse width.

21. The method of clause 20, further comprising passing the first clock signal through a delay circuit, and wherein detecting when the high pulse of the first clock signal is equal to or greater than the pulse width comprises detecting a logic state at an output of the delay circuit.

22. The method of clause 21, wherein detecting when the high pulse of the first clock signal is equal to or greater than the pulse width comprises detecting the high pulse of the first clock signal is equal to or greater than the pulse width when the detected logic state at the output of the delay circuit is high.

23. The method of clause 21 or 22, wherein a time delay of the delay circuit is greater than a period of the second clock signal.

24. The method of any one of clauses 21 to 23, further comprising:
combining the high pulse of the first clock signal passing through the delay circuit with the high pulse of the first clock signal bypassing the delay circuit to obtain a combined high pulse;
wherein passing the high pulse of the first clock signal to the clock path comprises passing the combined high pulse to the clock path.

25. The method of any one of clauses 20 to 24, wherein the first clock signal has a first frequency, the second clock signal has a second frequency, and the second frequency is higher than the first frequency.

26. The method of clause 25, wherein the second frequency is at least two orders of magnitude higher than the first frequency.

27. The method of any one of clauses 20 to 26, further comprising receiving an enable signal, and wherein detecting the change from the first mode to the second mode comprises detecting the change from the first mode to the second mode based on the enable signal.

28. The method of clause 27, wherein detecting the change from the first mode to the second mode based on the enable signal comprises detecting the change from the first mode to the second mode when the enable signal changes from a first value to a second value.

29. The method of any one of clauses 20 to 28, wherein the pulse width is greater than a period of the second clock signal.

30. The apparatus of any one of clauses 7 to 10, further comprising an OR gate having a first input, a second input, and an output, wherein the first input is coupled to the output of the delay circuit, and the second input is coupled to the output of the first gating circuit.

31. The apparatus of clause 30, further comprising:
a second gating circuit having an input and an output, wherein the input of the second gating circuit is configured to receive a third clock signal; and
a multiplexer having a first input, a second input, and an output, wherein the first input of the multiplexer is coupled to the output of the second gating circuit, and the second input of the multiplexer is coupled to the output of the OR gate.

32. The apparatus of clause 31, further comprising a clock path coupled to the output of the multiplexer.

33. The apparatus of clause 31 or 32, wherein the first clock signal has a first frequency, the third clock signal has a third frequency, and the third frequency is higher than the first frequency.

34. The apparatus of clause 33, wherein the third frequency is at least two orders of magnitude higher than the first frequency.

35. The apparatus of any one of clauses 30 to 34, wherein a time delay of the delay circuit is greater than a period of the third clock signal.

36. The apparatus of any one of clauses 30 to 35, wherein the control circuit is configured to:
detect a change from a first mode to a second mode based on the enable signal; and
in response to detecting the change from the first mode to the second mode, cause the first gating circuit to gate the first clock signal when the detected logic state at the output of the delay circuit changes from low to high.

37. The apparatus of clause 36, wherein the control circuit is configured to:
cause the multiplexer to select the second input when the enable signal indicates the first mode; and
cause the multiplexer to select the first input when the enable signal indicates the second mode.

38. The apparatus of clause 36 or 37, wherein the control circuit is configured to:
cause the first gating circuit to pass the first clock signal and cause the second gating circuit to gate the third clock signal when the enable signal indicates the first mode; and
cause the first gating circuit to gate the second clock signal and cause the second gating circuit to pass the third clock signal when the enable signal indicates the second mode.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a first gating circuit having an input and an output, wherein the input of the first gating circuit is configured to receive a first clock signal;
a delay circuit having an input and an output, wherein the input of the delay circuit is coupled to the output of the first gating circuit; and
a control circuit configured to:
receive an enable signal;
detect a logic state at the output of the delay circuit;
cause the first gating circuit to pass or gate the first clock signal based on the enable signal and the detected logic state at the output of the delay circuit;
detect a change from a first mode to a second mode based on the enable signal;
in response to detecting the change from the first mode to the second mode, cause the first gating circuit to gate the first clock signal when the detected logic state at the output of the delay circuit changes from low to high;
cause the first gating circuit to pass the first clock signal when the enable signal indicates the first mode; and
cause the first gating circuit to gate the first clock signal when the enable signal indicates the second mode.

2. The apparatus of claim 1, wherein the control circuit is configured to:
detect a logic state at the input of the first gating circuit;
detect a change from a first mode to a second mode based on the enable signal; and
in response to detecting the change from the first mode to the second mode,
cause the first gating circuit to pass the first clock signal when the detected logic state at the input of the first gating circuit is high and the detected logic state at the output of the delay circuit is low; and
cause the first gating circuit to gate the first clock signal when the detected logic state at the input of the first gating circuit is high and the detected logic state at the output of the delay circuit is high.

3. The apparatus of claim 1, wherein a time delay of the delay circuit is programmable.

4. The apparatus of claim 3, wherein the delay circuit is configured to:
receive a delay control signal comprising one or more bits, and
set the time delay of the delay circuit to one of multiple time delays based on the one or more bits.

5. The apparatus of claim 1, further comprising an OR gate having a first input, a second input, and an output, wherein the first input is coupled to the output of the delay circuit, and the second input is coupled to the output of the first gating circuit.

6. An apparatus, comprising:
a first gating circuit having an input and an output, wherein the input of the first gating circuit is configured to receive a first clock signal;
a delay circuit having an input and an output, wherein the input of the delay circuit is coupled to the output of the first gating circuit, wherein the delay circuit is configured to receive a second clock signal, and a time delay of the delay circuit is approximately equal to a multiple of a period of the second clock signal; and
a control circuit configured to:
receive an enable signal,
detect a logic state at the output of the delay circuit, and
cause the first gating circuit to pass or gate the first clock signal based on the enable signal and the detected logic state at the output of the delay circuit.

7. The apparatus of claim 6, wherein the multiple is programmable.

8. The apparatus of claim 6, wherein a period of the first clock signal is larger than the period of the second clock signal.

9. The apparatus of claim 8, wherein the period of the first clock signal is at least two orders of magnitude larger than the period of the second clock signal.

10. An apparatus, comprising:
a first gating circuit having an input and an output, wherein the input of the first gating circuit is configured to receive a first clock signal;
a delay circuit having an input and an output, wherein the input of the delay circuit is coupled to the output of the first gating circuit;
a control circuit configured to:
receive an enable signal,
detect a logic state at the output of the delay circuit, and
cause the first gating circuit to pass or gate the first clock signal based on the enable signal and the detected logic state at the output of the delay circuit;
an OR gate having a first input, a second input, and an output, wherein the first input is coupled to the output of the delay circuit, and the second input is coupled to the output of the first gating circuit;

a second gating circuit having an input and an output, wherein the input of the second gating circuit is configured to receive a second clock signal; and a multiplexer having a first input, a second input, and an output, wherein the first input of the multiplexer is coupled to the output of the second gating circuit, and the second input of the multiplexer is coupled to the output of the OR gate.

11. The apparatus of claim 10, further comprising a clock path coupled to the output of the multiplexer.

12. The apparatus of claim 10, wherein the first clock signal has a first frequency, the second clock signal has a second frequency, and the second frequency is higher than the first frequency.

13. The apparatus of claim 12, wherein the second frequency is at least two orders of magnitude higher than the first frequency.

14. The apparatus of claim 10, wherein a time delay of the delay circuit is greater than a period of the second clock signal.

15. The apparatus of claim 10, wherein the control circuit is configured to:
   detect a change from a first mode to a second mode based on the enable signal; and
   in response to detecting the change from the first mode to the second mode, cause the first gating circuit to gate the first clock signal when the detected logic state at the output of the delay circuit changes from low to high.

16. The apparatus of claim 15, wherein the control circuit is configured to:
   cause the multiplexer to select the second input when the enable signal indicates the first mode; and
   cause the multiplexer to select the first input when the enable signal indicates the second mode.

17. The apparatus of claim 15, wherein the control circuit is configured to:
   cause the first gating circuit to pass the first clock signal and cause the second gating circuit to gate the second clock signal when the enable signal indicates the first mode; and
   cause the first gating circuit to gate the second clock signal and cause the second gating circuit to pass the second clock signal when the enable signal indicates the second mode.

18. A method for glitch mitigation, comprising:
   receiving a first clock signal;
   receiving a second clock signal;
   passing the first clock signal to a clock path during a first mode;
   passing the second clock signal to the clock path during a second mode;
   detecting a change from the first mode to the second mode;
   in response to detecting the change from the first mode to the second mode, detecting when a high pulse of the first clock signal is equal to or greater than a pulse width; and
   gating the first clock signal when the high pulse of the first clock signal is equal to or greater the pulse width.

19. The method of claim 18, further comprising passing the first clock signal through a delay circuit, and wherein detecting when the high pulse of the first clock signal is equal to or greater than the pulse width comprises detecting a logic state at an output of the delay circuit.

20. The method of claim 19, wherein detecting when the high pulse of the first clock signal is equal to or greater than the pulse width comprises detecting the high pulse of the first clock signal is equal to or greater than the pulse width when the detected logic state at the output of the delay circuit is high.

21. The method of claim 19, wherein a time delay of the delay circuit is greater than a period of the second clock signal.

22. The method of claim 19, further comprising:
   combining the high pulse of the first clock signal passing through the delay circuit with the high pulse of the first clock signal bypassing the delay circuit to obtain a combined high pulse;
   wherein passing the high pulse of the first clock signal to the clock path comprises passing the combined high pulse to the clock path.

23. The method of claim 18, wherein the first clock signal has a first frequency, the second clock signal has a second frequency, and the second frequency is higher than the first frequency.

24. The method of claim 23, wherein the second frequency is at least two orders of magnitude higher than the first frequency.

25. The method of claim 18, further comprising receiving an enable signal, and wherein detecting the change from the first mode to the second mode comprises detecting the change from the first mode to the second mode based on the enable signal.

26. The method of claim 25, wherein detecting the change from the first mode to the second mode based on the enable signal comprises detecting the change from the first mode to the second mode when the enable signal changes from a first value to a second value.

27. The method of claim 18, wherein the pulse width is greater than a period of the second clock signal.

* * * * *